(12) United States Patent
Yoo et al.

(10) Patent No.: US 12,062,639 B2
(45) Date of Patent: Aug. 13, 2024

(54) SEMICONDUCTOR PACKAGE AND METHOD OF FABRICATING THE SAME

(71) Applicant: Samsung Electronics Co., Ltd., Suwon-si (KR)

(72) Inventors: Jaekyung Yoo, Seoul (KR); Jongho Lee, Hwaseong-si (KR); Yeongkwon Ko, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 156 days.

(21) Appl. No.: 17/529,798

(22) Filed: Nov. 18, 2021

(65) Prior Publication Data

US 2022/0320043 A1 Oct. 6, 2022

(30) Foreign Application Priority Data

Mar. 30, 2021 (KR) ........................ 10-2021-0041125

(51) Int. Cl.
| | |
|---|---|
| *H01L 25/065* | (2023.01) |
| *H01L 21/48* | (2006.01) |
| *H01L 21/56* | (2006.01) |
| *H01L 23/00* | (2006.01) |
| *H01L 23/31* | (2006.01) |

(Continued)

(52) U.S. Cl.
CPC ...... *H01L 25/0652* (2013.01); *H01L 21/4803* (2013.01); *H01L 21/563* (2013.01); *H01L 23/3157* (2013.01); *H01L 23/367* (2013.01); *H01L 23/49811* (2013.01); *H01L 23/5385* (2013.01); *H01L 23/562* (2013.01); *H01L 24/16* (2013.01); *H01L 24/73* (2013.01); *H01L 25/50* (2013.01); *H01L 2224/16227* (2013.01); *H01L 2224/73204* (2013.01)

(58) Field of Classification Search
CPC  H01L 25/0652; H01L 21/4803; H01L 21/563
See application file for complete search history.

(56) References Cited

U.S. PATENT DOCUMENTS

| | | |
|---|---|---|
| 7,279,366 B2 | 10/2007 | Bolken |
| 8,963,334 B2 | 2/2015 | Lin et al. |

(Continued)

FOREIGN PATENT DOCUMENTS

| | | |
|---|---|---|
| KR | 101440342 B1 | 9/2014 |
| KR | 101787832 B1 | 10/2017 |

*Primary Examiner* — Errol V Fernandes
(74) *Attorney, Agent, or Firm* — Muir Patent Law, PLLC

(57) ABSTRACT

A semiconductor package includes a lower substrate including a central region and an edge region, an upper substrate on the central region of the lower substrate, a first semiconductor chip on the upper substrate, a second semiconductor chip on the upper substrate and horizontally spaced apart from the first semiconductor chip, a reinforcing structure on the edge region of the lower substrate, and a molding layer that covers an inner sidewall of the reinforcing structure, a top surface of the lower substrate, a sidewall of the first semiconductor chip, a sidewall of the second semiconductor chip, and the upper substrate. The molding layer is interposed between the lower substrate and the upper substrate, between the upper substrate and the first semiconductor chip, and between the upper substrate and the second semiconductor chip. The first semiconductor chip is of a different type from the second semiconductor chip.

20 Claims, 18 Drawing Sheets

(51) Int. Cl.
  *H01L 23/367*   (2006.01)
  *H01L 23/498*   (2006.01)
  *H01L 23/538*   (2006.01)
  *H01L 25/00*    (2006.01)

(56) References Cited

U.S. PATENT DOCUMENTS

| | | |
|---|---|---|
| 9,059,304 B2 | 6/2015 | Meyer et al. |
| 9,337,120 B2 | 5/2016 | Li et al. |
| 9,922,924 B1 | 3/2018 | Shih |
| 10,037,974 B2 | 7/2018 | Chien et al. |
| 10,546,817 B2 | 1/2020 | Keser et al. |
| 10,741,419 B2 | 8/2020 | Karhade et al. |
| 2003/0218258 A1* | 11/2003 | Charles ............... H01L 23/293 257/E21.503 |
| 2006/0091560 A1* | 5/2006 | Kang ............... H01L 25/0652 257/E23.125 |
| 2016/0064365 A1* | 3/2016 | Jang ............... H01L 25/0652 257/777 |
| 2017/0117200 A1 | 4/2017 | Kim et al. |
| 2017/0263589 A1* | 9/2017 | Chang Chien ......... H01L 24/81 |
| 2020/0027837 A1* | 1/2020 | Jeng ............... H01L 21/4853 |
| 2020/0312755 A1 | 10/2020 | Choi |
| 2020/0395308 A1* | 12/2020 | Wu ............... H01L 21/4853 |
| 2022/0278037 A1* | 9/2022 | Hsu ............... H01L 23/5386 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0041125 filed on Mar. 30, 2021 in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including a molding layer and a method of fabricating the same.

A semiconductor package is provided to implement an integrated circuit chip to qualify for use in electronic products. A semiconductor package may include a semiconductor chip mounted on a printed circuit board (PCB), and bonding wires or bumps electrically connecting the semiconductor chip to the printed circuit board. With the recent development of electronic industry, the semiconductor package is variously developed to reach the goal of compact size, small weight, and/or low manufacturing cost. In addition, many kinds of semiconductor packages are adopted in an application field such as high-capacity mass storage devices.

SUMMARY

Some embodiments of the present inventive concepts provide a semiconductor package with increased electrical characteristics.

Some embodiments of the present inventive concepts provide a highly-integrated and compact-sized semiconductor package The object of the present inventive concepts is not limited to the mentioned above, and other objects which have not been mentioned above will be clearly understood to those skilled in the art from the following description.

According to some embodiments of the present inventive concepts, a semiconductor package may comprise: a lower substrate that includes a central region and an edge region; an upper substrate on the central region of the lower substrate; a first semiconductor chip on the upper substrate; a second semiconductor chip on the upper substrate and horizontally spaced apart from the first semiconductor chip; a reinforcing structure on the edge region of the lower substrate; and a molding layer that covers an inner sidewall of the reinforcing structure, a top surface of the lower substrate, a sidewall of the first semiconductor chip, a sidewall of the second semiconductor chip, and the upper substrate, the molding layer being interposed between the lower substrate and the upper substrate, between the upper substrate and the first semiconductor chip, and between the upper substrate and the second semiconductor chip. The first semiconductor chip may be of a different type from the second semiconductor chip.

According to some embodiments of the present inventive concepts, a semiconductor package may comprise: a lower substrate that includes a central region and an edge region; an upper substrate on the central region of the lower substrate; a first semiconductor chip on a top surface of the upper substrate; a chip stack on the top surface of the upper substrate and spaced apart in a first direction from the first semiconductor chip, the chip stack including a plurality of second semiconductor chips that are stacked on each other, and the first direction being parallel to a top surface of the lower substrate; a plurality of substrate bumps interposed between the lower substrate and the upper substrate and electrically connecting the lower substrate to the upper substrate; a plurality of chip bumps between the upper substrate and the first semiconductor chip and between the upper substrate and the second semiconductor chip; a reinforcing structure on the edge region of the lower substrate; and a molding layer that covers the top surface of the lower substrate and an inner sidewall of the reinforcing structure. A distance in the first direction between outer sidewalls, opposite to each other, of the reinforcing structure may be the same as or less than a width in the first direction between sidewalls, opposite to each other, of the lower substrate.

According to some embodiments of the present inventive concepts, a method of fabricating a semiconductor package may comprise: providing a lower substrate that includes a central region and an edge region, the lower substrate including a plurality of lower substrate pads at a top surface of the lower substrate; placing an upper substrate on the central region of the lower substrate; mounting a first semiconductor chip on the upper substrate; mounting on the upper substrate a second semiconductor chip, wherein on the upper substrate, the second semiconductor chip is horizontally spaced apart from the first semiconductor chip; forming a reinforcing structure on the edge region of the lower substrate; and forming a molding layer that covers an inner sidewall of the reinforcing structure and fills a space between the lower substrate and the upper substrate, a space between the upper substrate and the first semiconductor chip, and a space between the upper substrate and the second semiconductor chip.

DETAILED DESCRIPTION OF EMBODIMENTS

Some embodiments of the present inventive concepts will now be described in detail with reference to the accompanying drawings to aid in clearly explaining the present inventive concepts.

Figure 1:
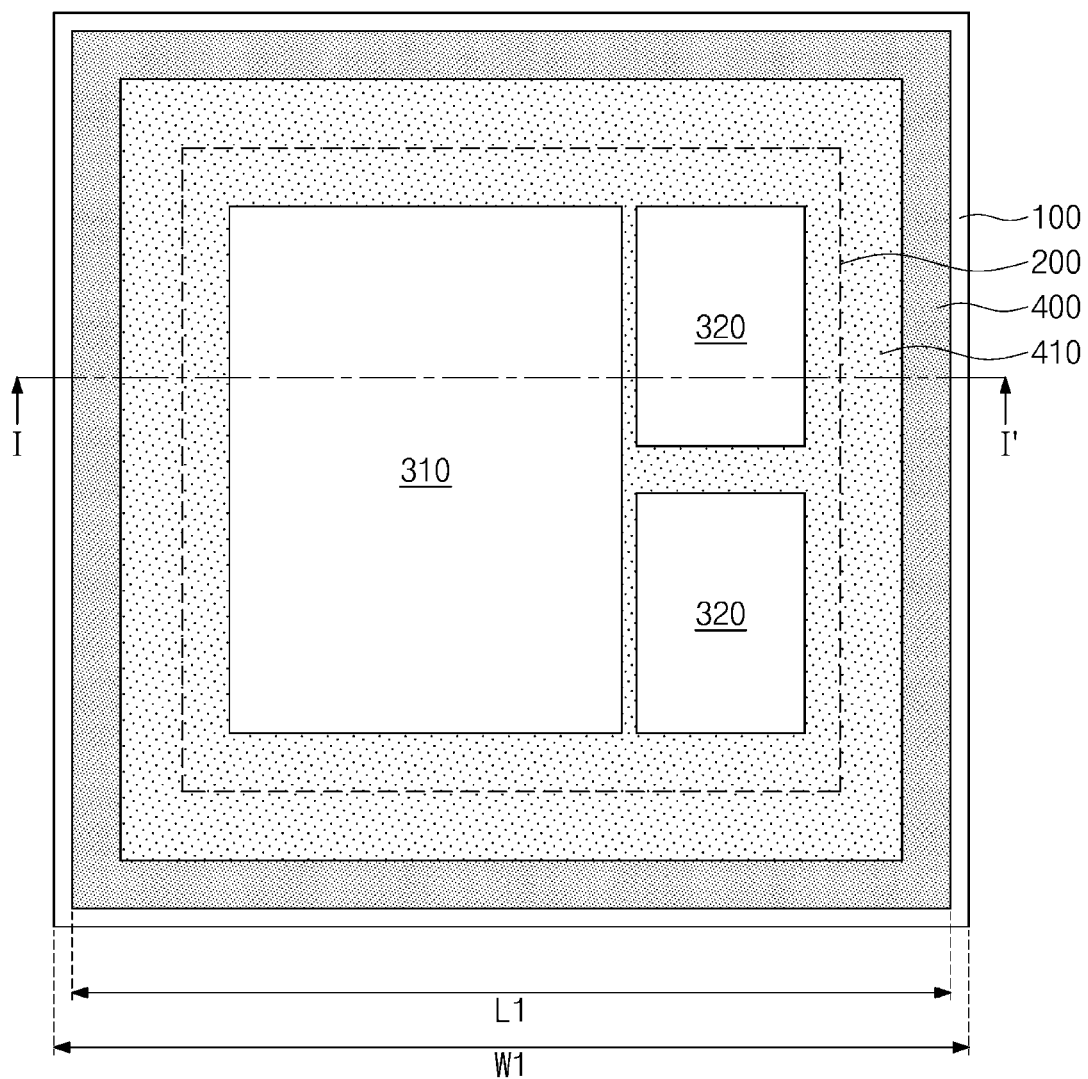
FIG. 1 illustrates a plan view showing a semiconductor package according to some embodiments of the present inventive concepts.
Figure 2:
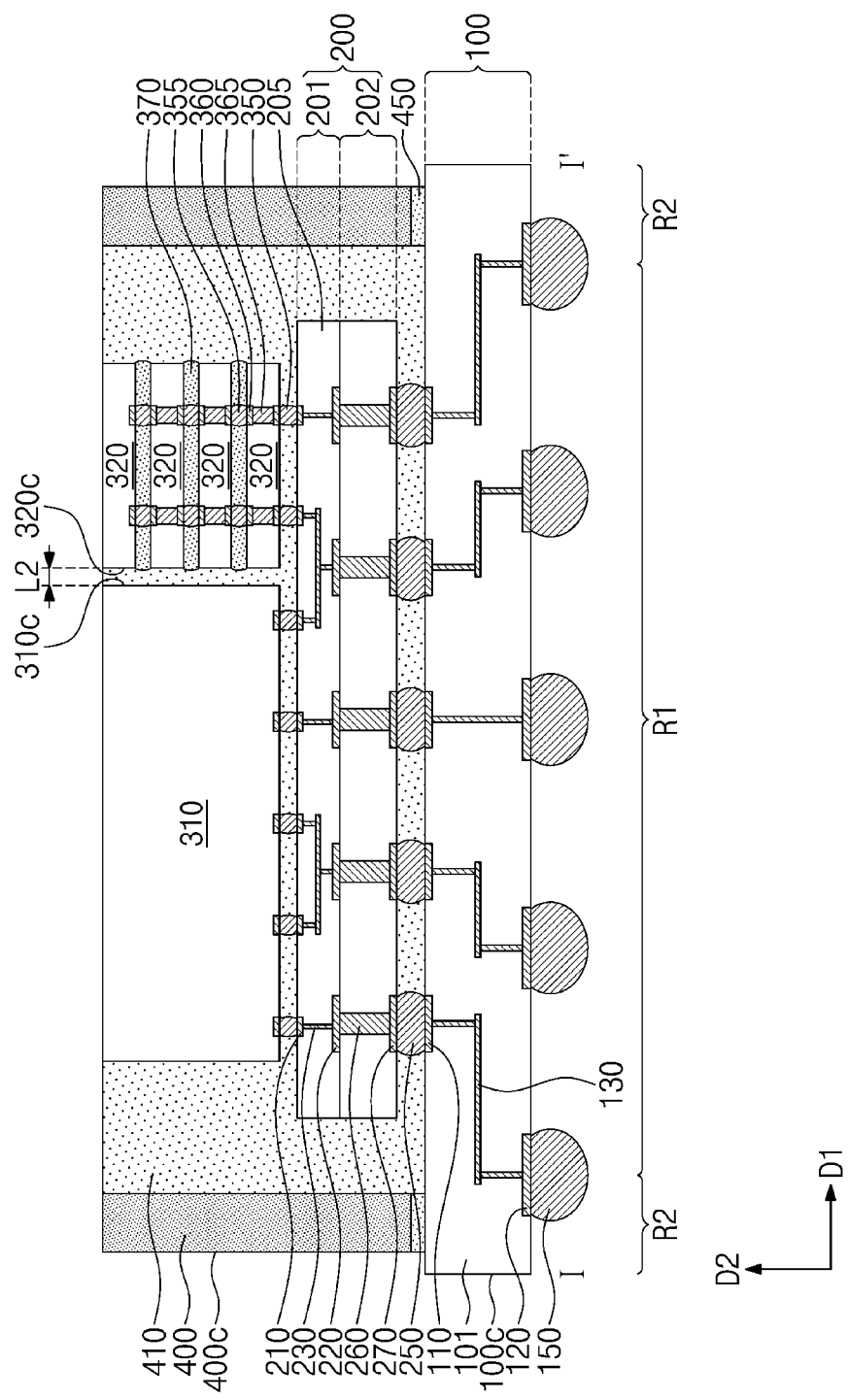
FIG. 2 illustrates a cross-sectional view taken along line I-I' of FIG. 1.

FIG. 1 illustrates a plan view showing a semiconductor package according to some embodiments of the present inventive concepts. FIG. 2 illustrates a cross-sectional view taken along line I-I' of FIG. 1.

Referring to FIGS. 1 and 2, a semiconductor package may include a lower substrate 100, an upper substrate 200, a first semiconductor chip 310, a second semiconductor chip 320, a reinforcing structure 400, and a molding layer 410.

The lower substrate 100 may include a dielectric base layer 101, lower substrate pads 110, terminal pads 120, and lower substrate lines 130. For example, the lower substrate 100 may be a printed circuit board (PCB). The lower substrate 100 may include a central region R1 and an edge region R2. When viewed in a plan view, the central region R1 may be a central zone, and the edge region R2 may be an edge zone. When viewed in a plan view, the edge region R2 may surround the central region R1.

The dielectric base layer 101 may be a single layer or may include a plurality of stacked layers. The lower substrate pads 110 may be adjacent to a top surface of the lower substrate 100, and the terminal pads 120 may be adjacent to a bottom surface of the lower substrate 100. For example, the lower substrate pads 110 may be formed at the top surface of the lower substrate 100, and the terminal pads 120 may be formed at the bottom surface of the lower substrate 100. The lower substrate pads 110 may be exposed on the top surface of the lower substrate 100. The lower substrate lines 130 may be located in the dielectric base layer 101, and may be electrically connected to the lower substrate pads 110 and the terminal pads 120. In this description, the phrase "two components are electrically connected/coupled to each other" may include the meaning of "the two components are directly connected to each other or indirectly connected to each other through other conductive component(s)." The lower substrate pads 110, the terminal pads 120, and the lower substrate lines 130 may include or may be formed of a conductive metallic material, for example, at least one metal selected from copper (Cu), aluminum (Al), tungsten (W), and titanium (Ti).

External terminals 150 may be provided on or may be provided at the bottom surface of the lower substrate 100. For example, the external terminals 150 may be located on bottom surfaces of the terminal pads 120. The external terminals 150 may be electrically connected to the lower substrate lines 130. The external terminals 150 may be coupled to an external device. Therefore, external electrical signals may be transmitted through the external terminals 150 to and from the lower substrate pads 110. The external terminals 150 may include or may be solder balls or solder bumps. The external terminals 150 may include or may be formed of a conductive metallic material, for example, at least one metal selected from tin (Sn), lead (Pb), silver (Ag), zinc (Zn), nickel (Ni), gold (Au), copper (Cu), aluminum (Al), and bismuth (Bi).

The upper substrate 200 may be located on the central region R1 of the lower substrate 100. The upper substrate 200 may include a substrate layer 202 and a wiring layer 201 on the substrate layer 202. The wiring layer 201 and the substrate layer 202 may be collectively called an interposer substrate.

The wiring layer 201 may include upper pads 210, upper substrate lines 220, internal lines 230, and a wiring dielectric layer 205. The wiring dielectric layer 205 may cover the upper pads 210, the upper substrate lines 220, and the internal lines 230. The upper pads 210 may be adjacent to or may be provided at a top surface of the wiring layer 201, and the upper substrate lines 220 may be adjacent to or may be provided at a bottom surface of the wiring layer 201. The upper pads 210 may be exposed on the top surface of the wiring layer 201. The internal lines 230 may be located in the wiring dielectric layer 205, and may be electrically connected to the upper pads 210 and the upper substrate lines 220. The upper pads 210, the upper substrate lines 220, and the internal lines 230 may include or may be formed of a conductive metallic material, for example, at least one metal selected from copper (Cu), aluminum (Al), tungsten (W), and titanium (Ti).

The substrate layer 202 may include a plurality of through electrodes 260 and a plurality of lower pads 270. For example, the substrate layer 202 may be a silicon (Si) substrate. The through electrodes 260 may be located in the substrate layer 202 and may penetrate the substrate layer 202. Each of the through electrodes 260 may be electrically connected to a corresponding one of the upper substrate lines 220. The lower pads 270 may be located adjacent to or may be provided at a bottom surface of the substrate layer 202. The lower pads 270 may be electrically connected to the through electrodes 260. The through electrodes 260 and the lower pads 270 may include or may be formed of a conductive metallic material, for example, at least one metal selected from copper (Cu), aluminum (Al), tungsten (W), and titanium (Ti).

Substrate bumps 250 may be interposed between the lower substrate 100 and the upper substrate 200. The lower substrate 100 and the upper substrate 200 may be electrically connected to each other through substrate bumps 250. Each of the lower pads 270 may be electrically connected through a corresponding substrate bump 250 to a corresponding lower substrate pad 110. The substrate bumps 250 may include or may be formed of a conductive material, and may have or may be formed of at least one selected from a solder ball shape, a bump shape, and a pillar shape. A pitch of the substrate bumps 250 may be less than that of the external terminals 150.

The first semiconductor chip 310 may be mounted on the upper substrate 200. The first semiconductor chip 310 may include a logic chip, a buffer chip, or a system-on-chip (SOC). For example, the first semiconductor chip 310 may be an application specific integrated circuit (ASIC) chip or an application processor (AP) chip. The ASIC chip may include an application specific integrated circuit (ASIC). The first semiconductor chip 310 may include a central processing unit (CPU) or a graphic processing unit (GPU).

A plurality of second semiconductor chips 320 may be mounted on the upper substrate 200. The second semiconductor chips 320 may be located horizontally spaced apart from the first semiconductor chip 310, or may be located spaced apart from the first semiconductor chip 310 in a first direction D1 parallel to the top surface of the lower substrate 100. The second semiconductor chips 320 may be stacked vertically (e.g., in a second direction D2) on the upper substrate 200 to form a chip stack. In some embodiments, the chip stack may be provided in plural. The second semiconductor chips 320 may be of a different type from the first semiconductor chip 310. The second semiconductor chips 320 may be memory chips. The memory chips may include high bandwidth memory (HBM) chips. For example, the second semiconductor chips 320 may include dynamic random memory (DRAM) chips. Differently from that shown in FIG. 2, the number of the first semiconductor chip 310 and of the second semiconductor chips 320 may be variously changed.

Each of the second semiconductor chips 320 may include integrated circuits (not shown) and through vias 365. The integrated circuits may be provided in the second semiconductor chips 320. The through vias 365 may penetrate a corresponding one of the second semiconductor chips 320 and may have electrical connection with the integrated circuits. The through vias 365 may include or may be formed of a conductive metallic material, for example, at least one metal selected from copper (Cu), aluminum (Al), tungsten (W), and titanium (Ti). In some embodiments, an uppermost one of the second semiconductor chips 320 may not include the through vias 365.

The first semiconductor chip 310 may include chip pads 360 adjacent to or provided at a bottom surface of the first semiconductor chip 310. The second semiconductor chips 320 may include chip pads 360 adjacent to or provided at top and bottom surfaces of the second semiconductor chips 320. However, the chip pads 360 may not be provided on or may not be provided at the top surface of the uppermost second semiconductor chip 320. For example, the chip pads 360 may be connected to upper pads 210 of the upper substrate 200, respectively. In some embodiments, the chip pads 360 may contact the upper pads 210 of the upper substrate 200. The chip pads 360 may include or may be formed of a conductive metallic material, for example, at least one metal selected from copper (Cu), aluminum (Al), tungsten (W), and titanium (Ti). It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Upper bumps 355 may be interposed between two neighboring second semiconductor chips 320. The upper bumps 355 may be electrically connected to the through vias 365 of a corresponding one of the second semiconductor chips 320. The upper bumps 355 may connect the second semiconductor chips 320 with each other.

A chip under-fill layer 370 may be interposed between two neighboring second semiconductor chips of the second semiconductor chips 320. The chip under-fill layer 370 may fill a space between the upper bumps 355 and may encapsulate each of the upper bumps 355. For example, the chip under-fill layer 370 may include or may be formed of a non-conductive film (NCF), such as an Ajinomoto build-up film (ABF).

Chip bumps 350 may be interposed between the upper substrate 200 and the first semiconductor chip 310 and between the upper substrate 200 and a lowermost one of the second semiconductor chips 320. The chip bumps 350 may electrically connect the upper substrate 200 to the first semiconductor chip 310, and may electrically connect the upper substrate 200 to the lowermost second semiconductor chip 320. Each of the chip pads 360 of the first and second semiconductor chips 310 and 320 may be electrically connected through a corresponding chip bump 350 to a corresponding upper pad 210. The chip bumps 350 may include or may be formed of a conductive material and may have at least one of a solder ball shape, a bump shape, and a pillar shape. A pitch of the chip bumps 350 may be less than that of the substrate bumps 250.

The reinforcing structure 400 may be located on the edge region R2 of the lower substrate 100. When viewed in a plan view, the reinforcing structure 400 may surround the upper substrate 200. In some embodiments, the reinforcing structure 400 may be located spaced apart from and may not be in contact with the upper substrate 200. A length L1 in the first direction D1 between facing outer walls 400c (e.g., outer sidewalls opposite to each other) of the reinforcing structure 400 may be the same as or less than a width W1 in the first direction D1 between facing sidewalls 100c, opposite to each other, of the lower substrate 100. For example, in some embodiments, the outer wall 400c of the reinforcing structure 400 may overlap vertically (e.g., in the second direction D2) with an adjacent sidewall 100c of the lower substrate 100. In some embodiments, the outer wall 400c of the reinforcing structure 400 may be located between an adjacent sidewall 100c of the lower substrate 100 and an adjacent sidewall of the upper substrate 200. The reinforcing structure 400 may have a ring shape when viewed in a plan view. For example, when viewed in a plan view, the reinforcing structure 400 may have a square ring shape or a square ring shape whose a corner is rounded. For example, an outer perimeter of the reinforcing structure 400 may be of a square ring shape or a square ring shape with a rounded corner.

The reinforcing structure 400 may include or may be formed of a conductive metallic material. For example, the conductive metallic material may include at least one selected from copper (Cu), titanium (Ti), palladium (Pd), aluminum (Al), nickel (Ni), gold (Au), platinum (Pt), and stainless steels (SUS).

An adhesive layer 450 may be located on the edge region R2 of the lower substrate 100. The adhesive layer 450 may be interposed between the lower substrate 100 and the reinforcing structure 400. For example, the adhesive layer 450 may be located between the top surface of the lower substrate 100 and a bottom surface of the reinforcing structure 400. The adhesive layer 450 may fix the reinforcing structure 400 onto the lower substrate 100. For example, the adhesive layer 450 may include or may be formed of at least one selected from silicon oxide (SiOx), aluminum oxide (AlOx), and zinc oxide (ZnO), wherein x is a positive real number.

The molding layer 410 may be provided on the lower substrate 100. The molding layer 410 may cover an inner wall (e.g., an inner sidewall) of the reinforcing structure 400, the top surface of the lower substrate 100, a sidewall of the first semiconductor chip 310, a sidewall of the second semiconductor chip 320, and the upper substrate 200. The molding layer 410 may be interposed between the lower substrate 100 and the upper substrate 200, between the upper substrate 200 and the first semiconductor chip 310, and between the upper substrate 200 and the lowermost second semiconductor chip 320. The molding layer 410 may be interposed between two adjacent substrate bumps and encapsulate each of the substrate bumps 250. The molding layer 410 may be interposed between two adjacent chip bumps and encapsulate each of the chip bumps 350. According to the present inventive concepts, no under-fill layer may be separately included between the upper substrate 200 and the first semiconductor chip 310, and between the upper substrate 200 and the lowermost second semiconductor chip 320. Therefore, a horizontal distance may be reduced between the first semiconductor chip 310 and the second semiconductor chips 320. For example, a range of about 1 μm to about 100 μm may be given as a minimum distance L2 in the first direction D1 between a sidewall 310c of the first semiconductor chip 310 and a sidewall 320c of the second semiconductor chip 320. The sidewalls 310c and 320c may be adjacent to each other.

The molding layer 410 may expose a top surface of the first semiconductor chip 310 and a top surface of the uppermost second semiconductor chip 320. In some embodiments of the present inventive concepts, differently from that shown, the molding layer 410 may cover the top surface of the first semiconductor chip 310 and the top surface of the uppermost second semiconductor chip 320.

The molding layer 410 may include a dielectric polymer, such as an epoxy molding compound (EMC). The molding layer 410 may further include a filler, for example, silica. For example, the molding layer 410 may be a dielectric polymer with fillers distributed therein. For example, an amount of the silica in the molding layer 410 may range from about 50% to about 100%. For example, the amount of the silica in the molding layer 410 may range from about 50 wt % to about 100 wt %. The molding layer 410 may include or may be formed of a different material from that of the chip under-fill layer 370.

The present inventive concepts may include reinforcing structure 400 located on the lower substrate 100, and may also include the molding layer 410 that covers the inner wall of the reinforcing structure 400, the top surface of the lower substrate 100, the sidewall of the first semiconductor chip 310, the sidewalls of the second semiconductor chips 320, and the upper substrate 200, which may result in an increase in mechanical strength of the semiconductor package.

According to the present inventive concepts, because no under-fill layer is separately included between the upper substrate 200 and the first semiconductor chip 310 and between the upper substrate 200 and the lowermost second semiconductor chip 320, a horizontal distance may be minimized between the first semiconductor chip 310 and the second semiconductor chips 320. Therefore, a signal delivery speed may be maximized between the first semiconductor chip 310 and the second semiconductor chips 320, and accordingly, the first and second semiconductor chips 310 and 320 may have communicate with each other with an signal with improved electrical characteristics, thereby operating faster. Moreover, because no under-fill layer is separately included between the lower substrate 100 and the upper substrate 200, between the upper substrate 200 and the first semiconductor chip 310, and between the upper substrate 200 and the lowermost second semiconductor chip 320, the semiconductor package may effectively become smaller in size compared to if an under-fill layer is used.

Figure 3:
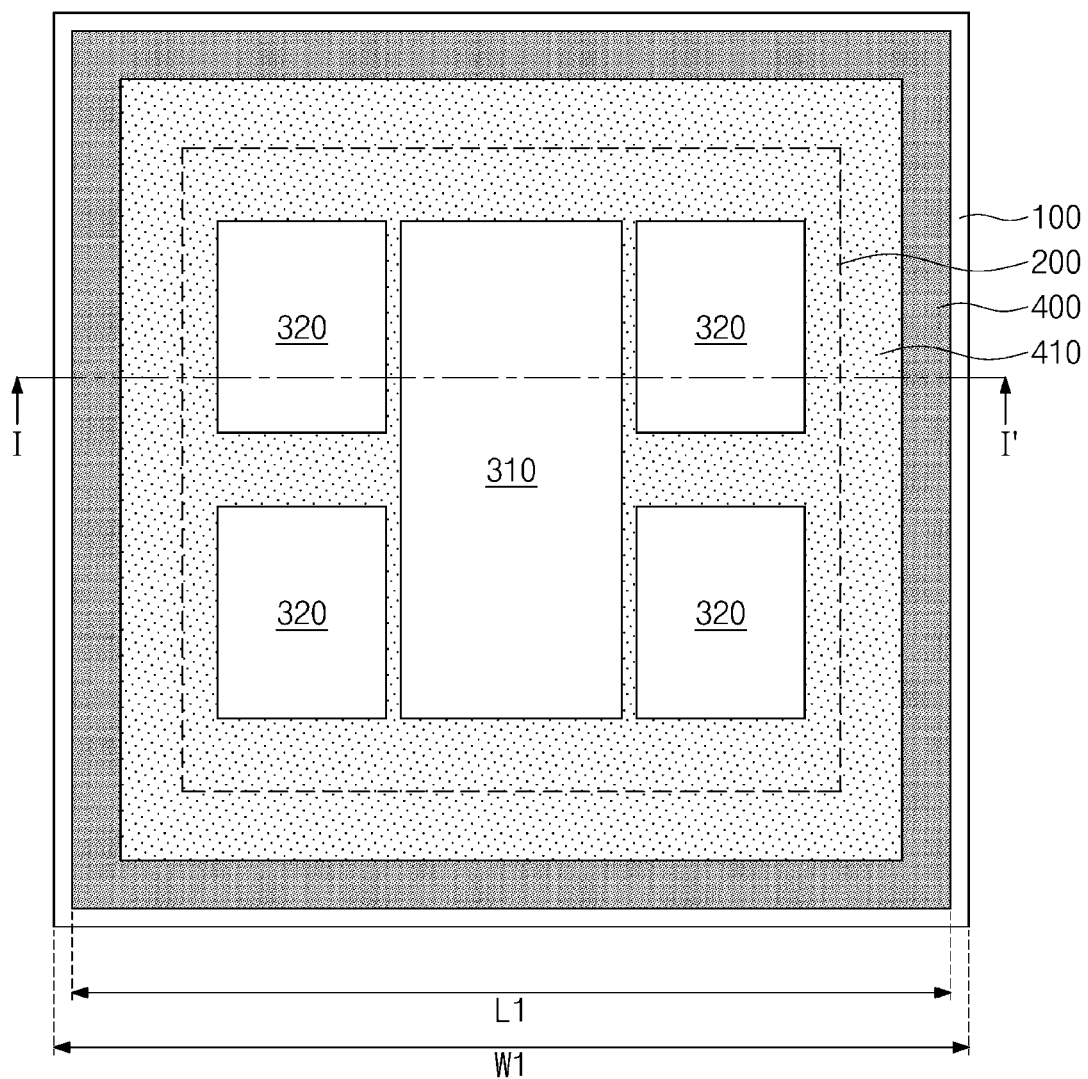
FIG. 3 illustrates a plan view showing a semiconductor package according to some embodiments of the present inventive concepts.
Figure 4:
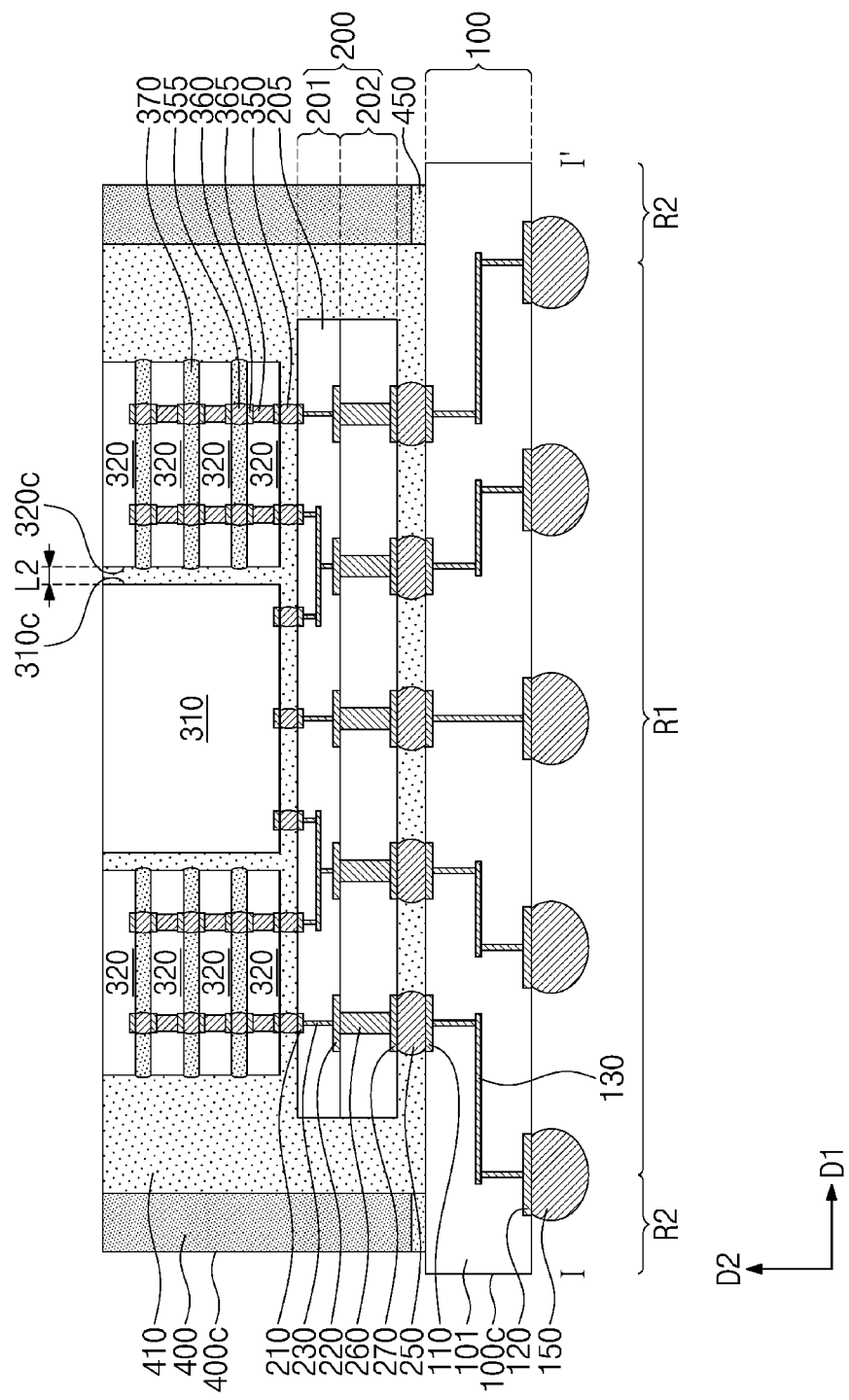
FIG. 4 illustrates a cross-sectional view taken along line I-I' of FIG. 3.

FIG. 3 illustrates a plan view showing a semiconductor package according to some embodiments of the present inventive concepts. FIG. 4 illustrates a cross-sectional view taken along line I-I' of FIG. 3.

Referring to FIGS. 3 and 4, a semiconductor package may include a lower substrate 100, an upper substrate 200, a first semiconductor chip 310, a second semiconductor chip 320, a reinforcing structure 400, and a molding layer 410. A duplicate description will be omitted below.

The first semiconductor chip 310 may be mounted on the upper substrate 200. A plurality of second semiconductor chips 320 may be mounted on the upper substrate 200. The second semiconductor chips 320 may be located spaced apart horizontally (e.g., in the first direction D1) from the first semiconductor chip 310. The second semiconductor chips 320 may be stacked vertically (e.g., in the second direction D2) on the upper substrate 200 to form a chip stack. The chip stack may be provided in plural. The chip stacks may be located spaced apart from each other across the first semiconductor chip 310. Differently from that shown, the number of the chip stacks, of the first semiconductor chip 310, and of the second semiconductor chips 320 may be variously changed. Except that the chip stacks are located spaced apart from each other across the first semiconductor chip 310, the description above with reference to FIGS. 1 and 2 may be substantially identically applicable to this embodiment.

Figure 5:
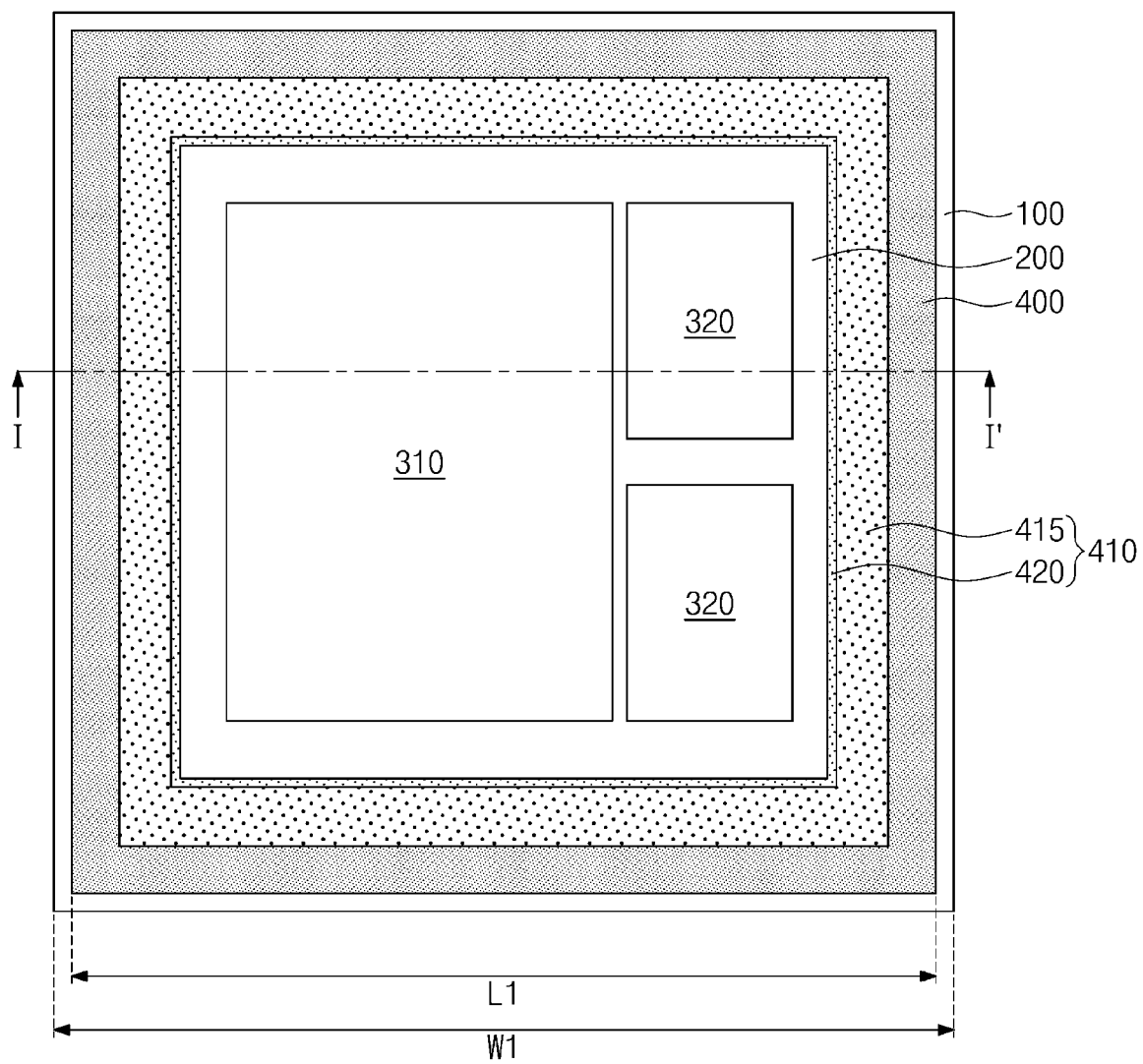
FIG. 5 illustrates a plan view showing a semiconductor package according to some embodiments of the present inventive concepts.
Figure 6:
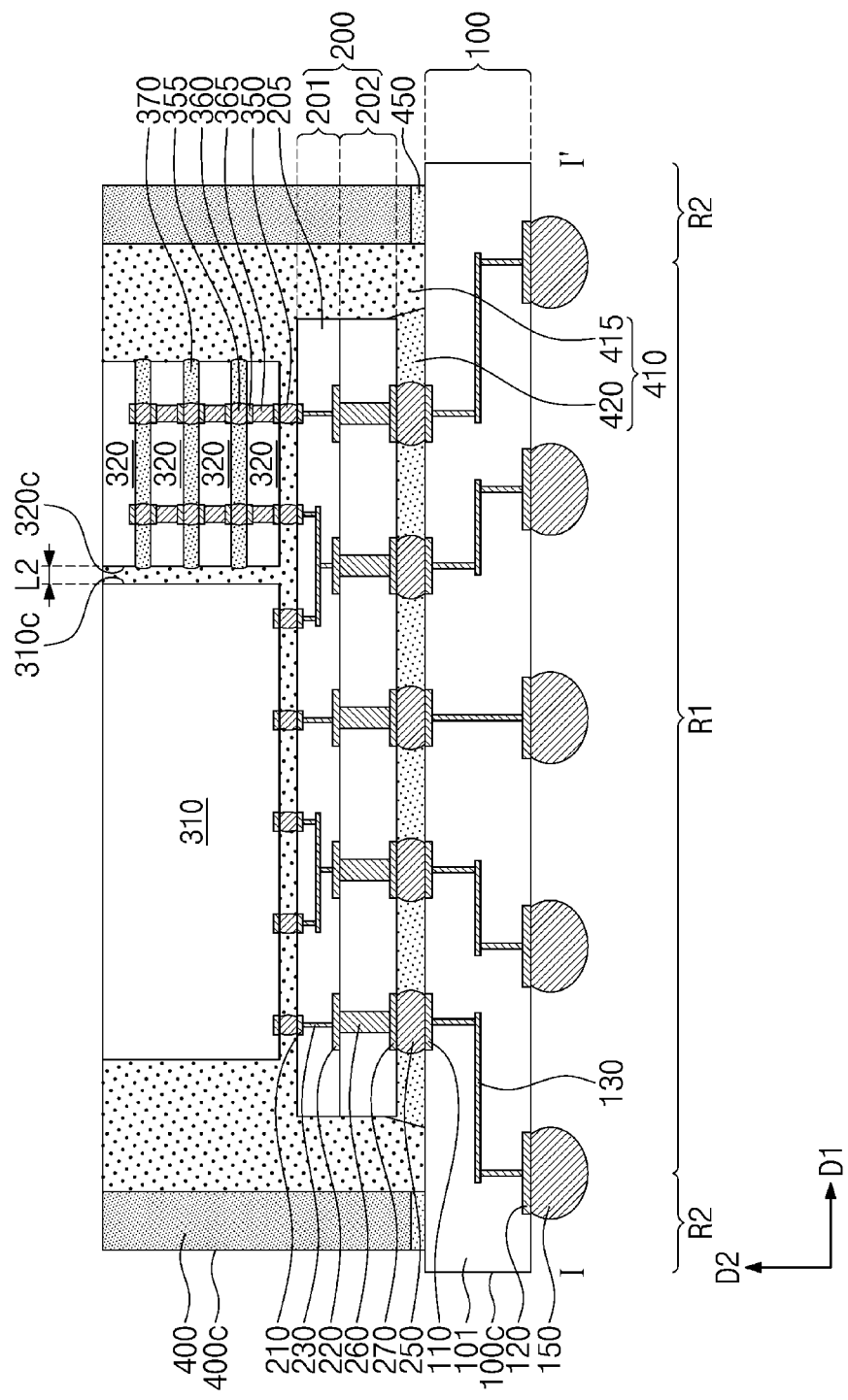
FIG. 6 illustrates a cross-sectional view taken along line I-I' of FIG. 5.

FIG. 5 illustrates a plan view showing a semiconductor package according to some embodiments of the present inventive concepts. FIG. 6 illustrates a cross-sectional view taken along line I-I' of FIG. 5.

Referring to FIGS. 5 and 6, a semiconductor package may include a lower substrate 100, an upper substrate 200, a first semiconductor chip 310, a second semiconductor chip 320, a reinforcing structure 400, and a molding layer 410. A duplicate description will be omitted below.

The molding layer 410 may include an upper molding layer 415 and a lower molding layer 420. The lower molding layer 420 may be interposed between the lower substrate 100 and the upper substrate 200. The lower molding layer 420 may be interposed between and encapsulate the substrate bumps 250. The lower molding layer 420 may cover a portion of the top surface of the lower substrate 100.

The upper molding layer 415 may cover the inner wall (e.g., an inner sidewall) of the reinforcing structure 400, another portion of the top surface of the lower substrate 100, the top surface of the upper substrate 200, a portion of the sidewall of the upper substrate 200, the sidewall of the first semiconductor chip 310, the sidewalls of the second semiconductor chips 320, and the lower molding layer 420. The upper molding layer 415 may be interposed between the upper substrate 200 and the first semiconductor chip 310 and between the upper substrate 200 and the lowermost second semiconductor chip 320. The upper molding layer 415 may be interposed between two adjacent chip bumps of the chip bumps 350 and encapsulate each of the chip bumps 350.

The upper molding layer 415 and the lower molding layer 420 may include a dielectric polymer, such as an epoxy molding compound (EMC). The upper and lower molding layers 415 and 420 may further include a filler, for example, silica. For example, the upper molding layer 415 may be a dielectric polymer with fillers distributed therein. An amount of the silica in the upper molding layer 415 may be different from that of the silica in the lower molding layer 420. For example, an amount of the silica in the upper molding layer 415 may range from about 50% to about 100%. For example, the amount of the silica in the upper molding layer 415 may range from about 50 wt % to about 100 wt %. An amount of the silica in the lower molding layer 420 may range from greater than about 0% to less than about 50%. For example, the amount of the silica in the lower molding layer 420 may range from greater than about 0 wt % to less than about 50 wt %

The present inventive concepts may include the reinforcing structure 400 located on the lower substrate 100, and may also include the upper molding layer 415 that covers the inner wall of the reinforcing structure 400, a portion of the top surface of the lower substrate 100, the sidewall of the first semiconductor chip 310, the sidewalls of the second semiconductor chips 320, and the upper substrate 200, which may result in an increase in mechanical strength of the semiconductor package.

Except that the molding layer 410 includes the upper molding layer 415 and the lower molding layer 420, the description above with reference to FIGS. 1 and 2 may be substantially identically applicable to this embodiment.

Figure 7:
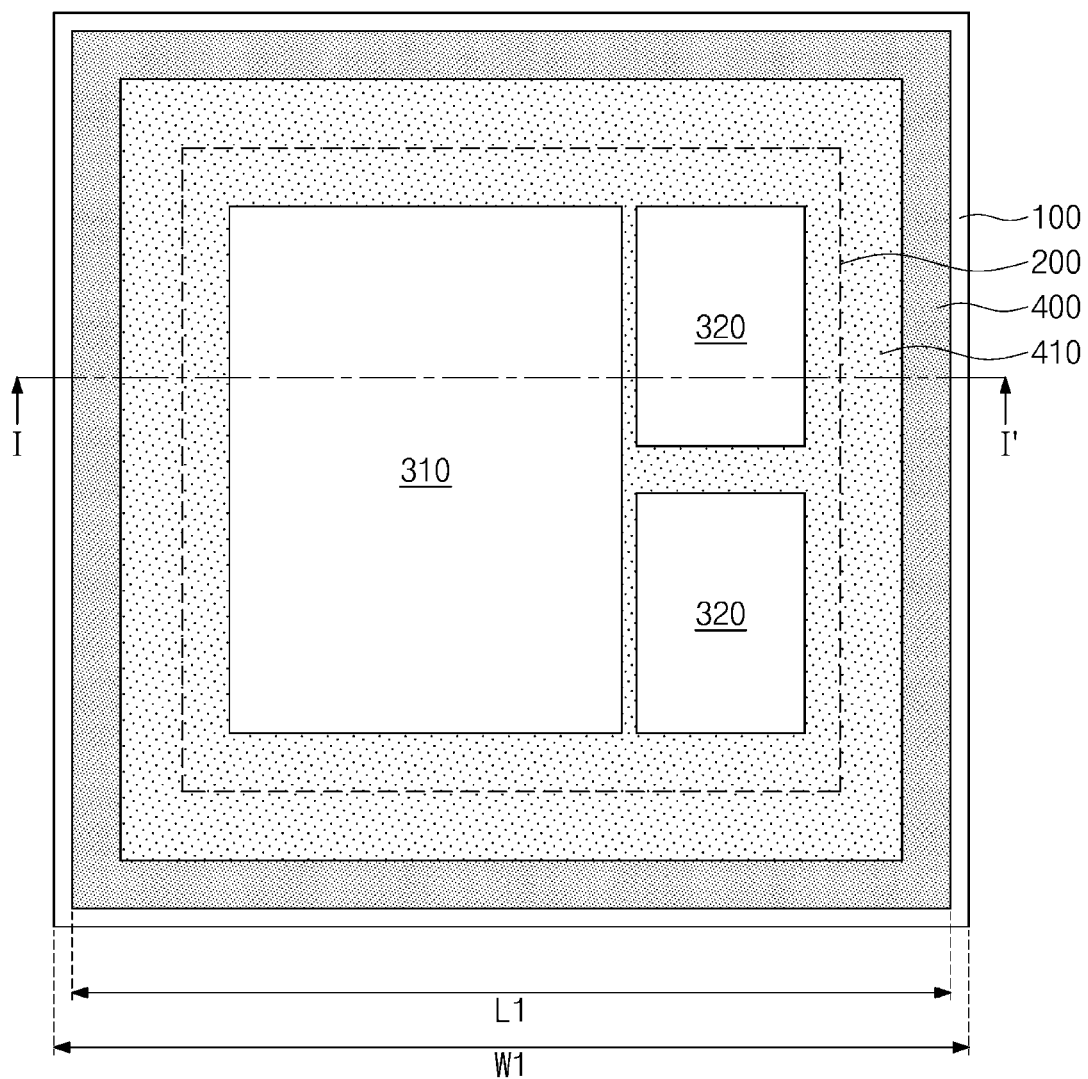
FIG. 7 illustrates a plan view showing a semiconductor package according to some embodiments of the present inventive concepts.
Figure 8:
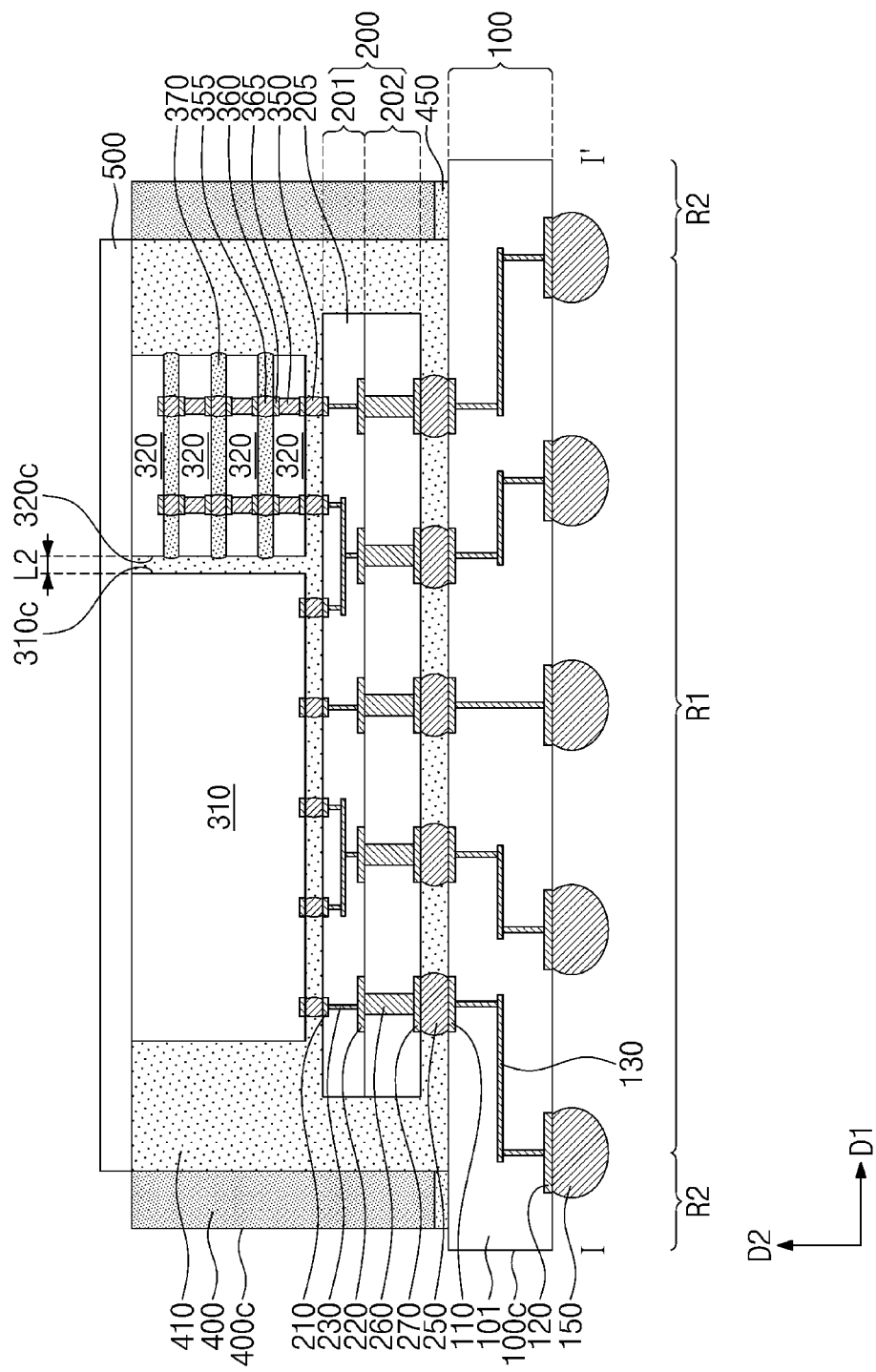
FIG. 8 illustrates a cross-sectional view taken along line I-I' of FIG. 7.

FIG. 7 illustrates a plan view showing a semiconductor package according to some embodiments of the present inventive concepts. FIG. 8 illustrates a cross-sectional view taken along line I-I' of FIG. 7.

Referring to FIGS. 7 and 8, a semiconductor package may include a lower substrate 100, an upper substrate 200, a first semiconductor chip 310, a second semiconductor chip 320, a reinforcing structure 400, and a molding layer 410, and may further include a thermal radiation plate 500. A duplicate description will be omitted below.

The thermal radiation plate 500 may be located on at least one selected from the top surface of the first semiconductor chip 310 and the top surface of the uppermost second semiconductor chip 320. For example, the thermal radiation plate 500 may be in contact with at least one selected from the top surface of the first semiconductor chip 310 and the top surface of the uppermost second semiconductor chip 320. The thermal radiation plate 500 may extend onto and cover a top surface of the molding layer 410. The thermal radiation plate 500 may include a heat slug or a heat sink. The thermal radiation plate 500 may include or may be formed of a material, such as metal, whose thermal conductivity is high. In some embodiments, differently from that shown, the thermal radiation plate 500 may further extend onto a top surface of the reinforcing structure 400.

Except that the thermal radiation plate 500 is further included, the description above with reference to FIGS. 1 and 2 may be substantially identically applicable to this embodiment.

Figure 9:
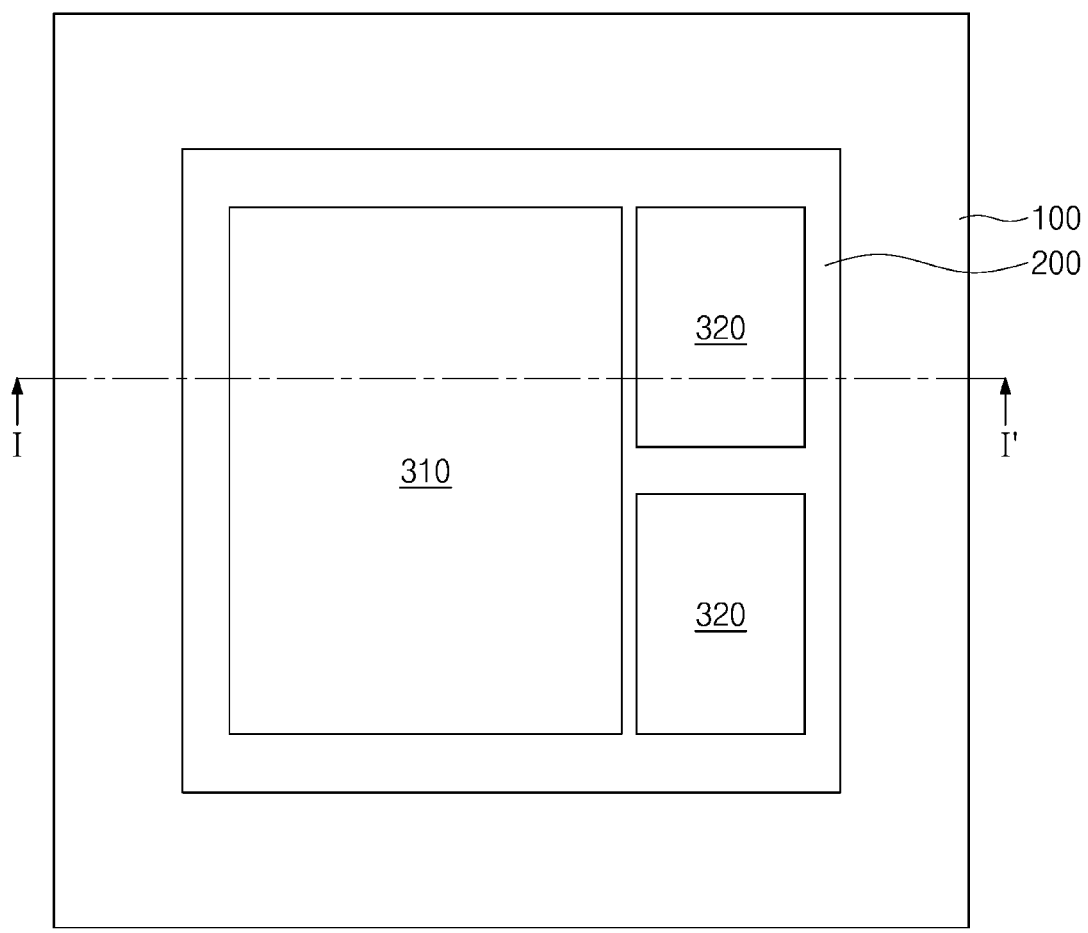
FIGS. 9, 11, and 13 illustrate plan views showing a method of fabricating a semiconductor package according to some embodiments of the present inventive concepts.
Figure 10:
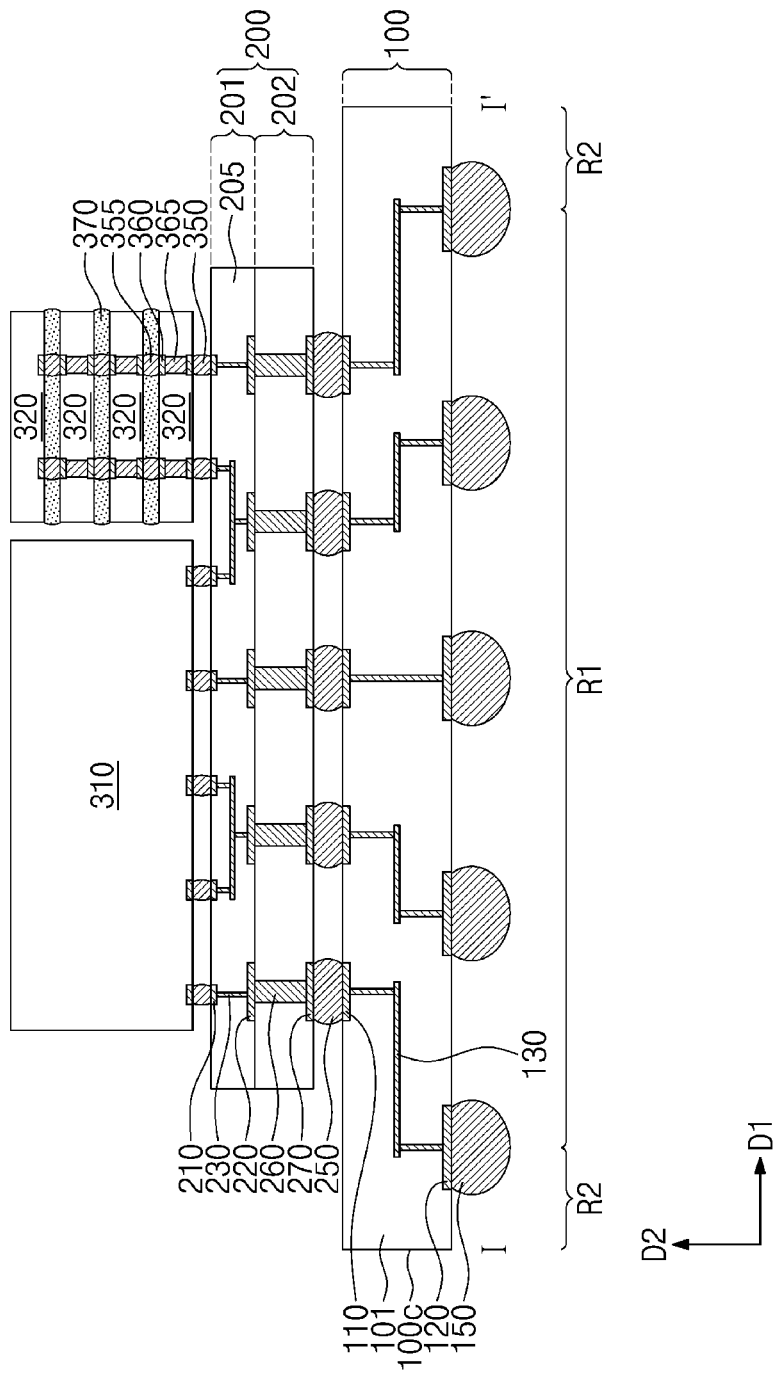
FIGS. 10, 12, and 14 illustrate cross-sectional views taken along line I-I' of FIGS. 9, 11, and 13, respectively, showing a method of fabricating a semiconductor package according to some embodiments of the present inventive concepts.
Figure 11:
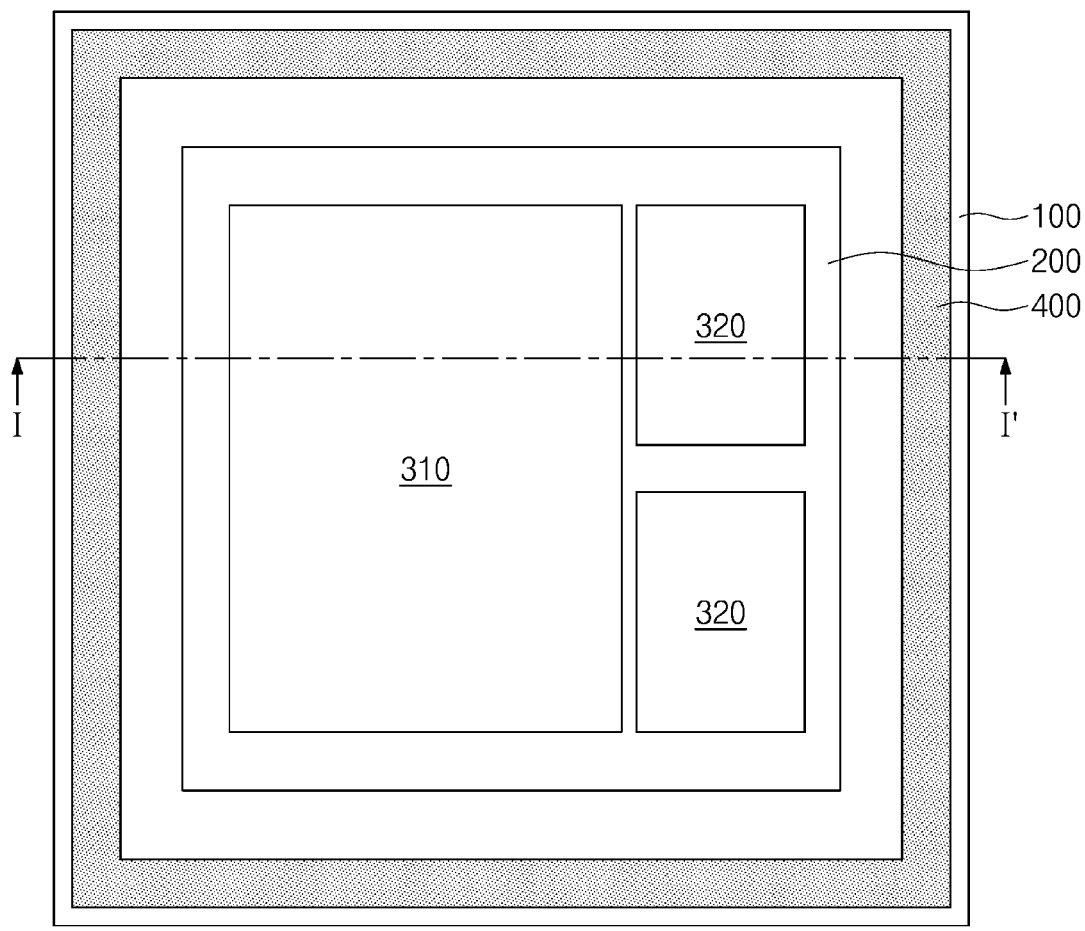
Figure 12:
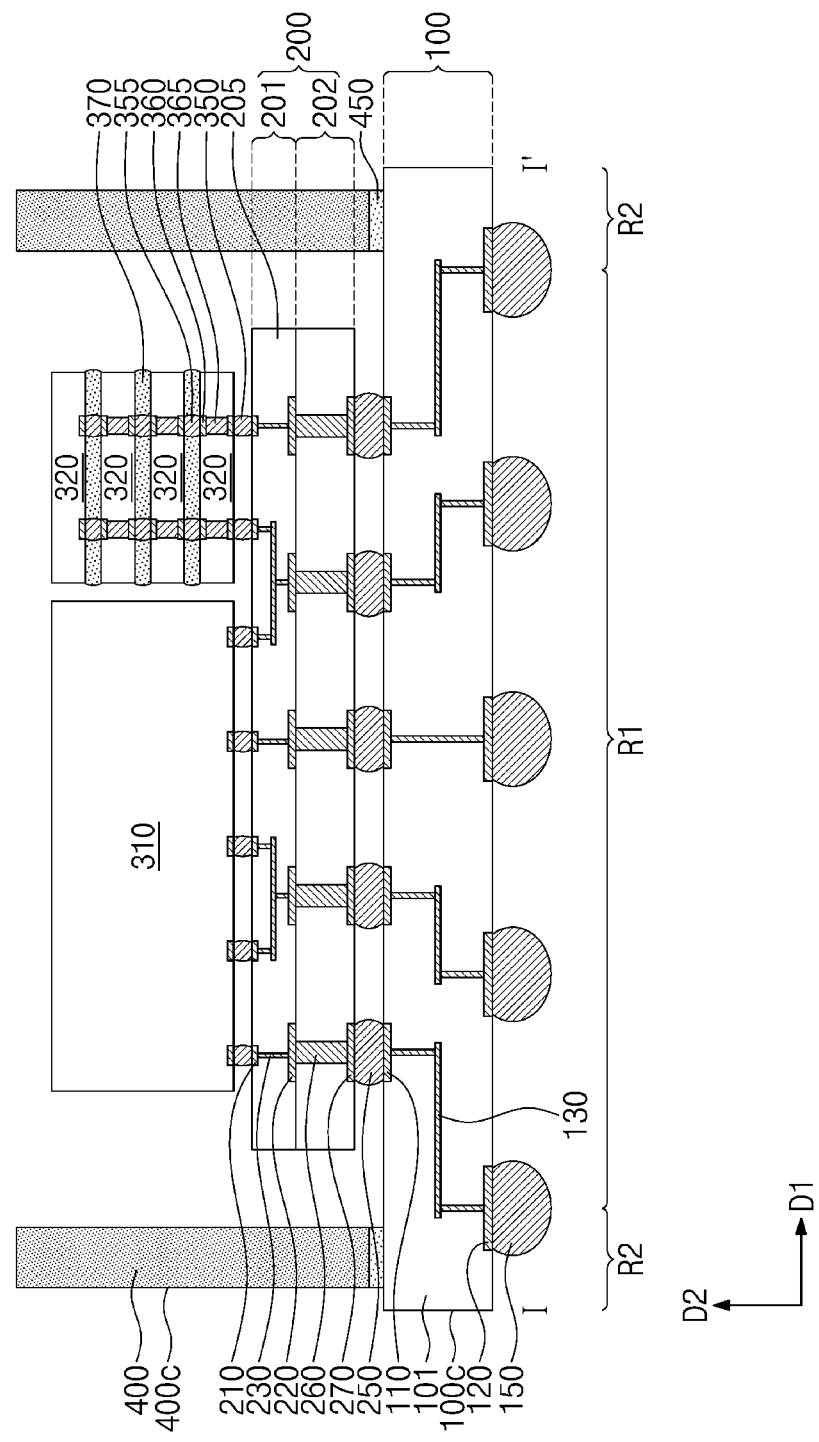
Figure 13:
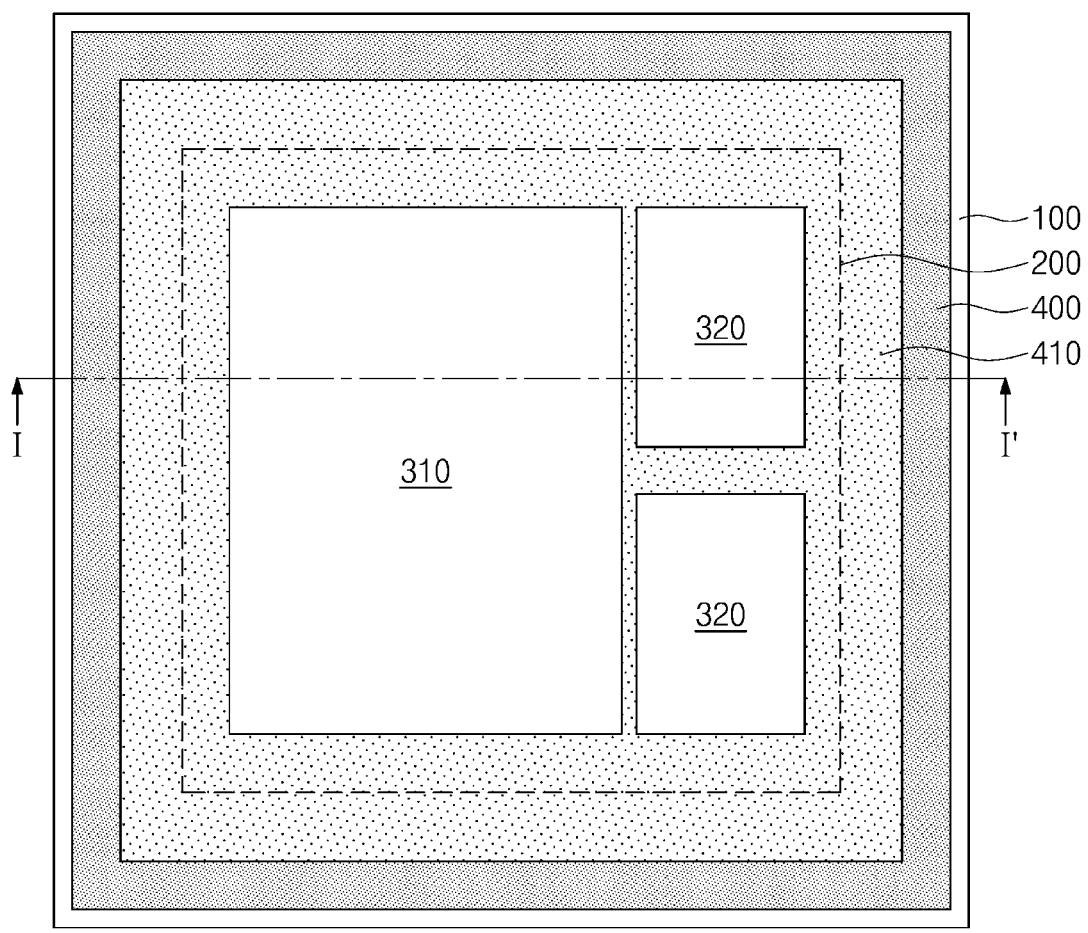
Figure 14:
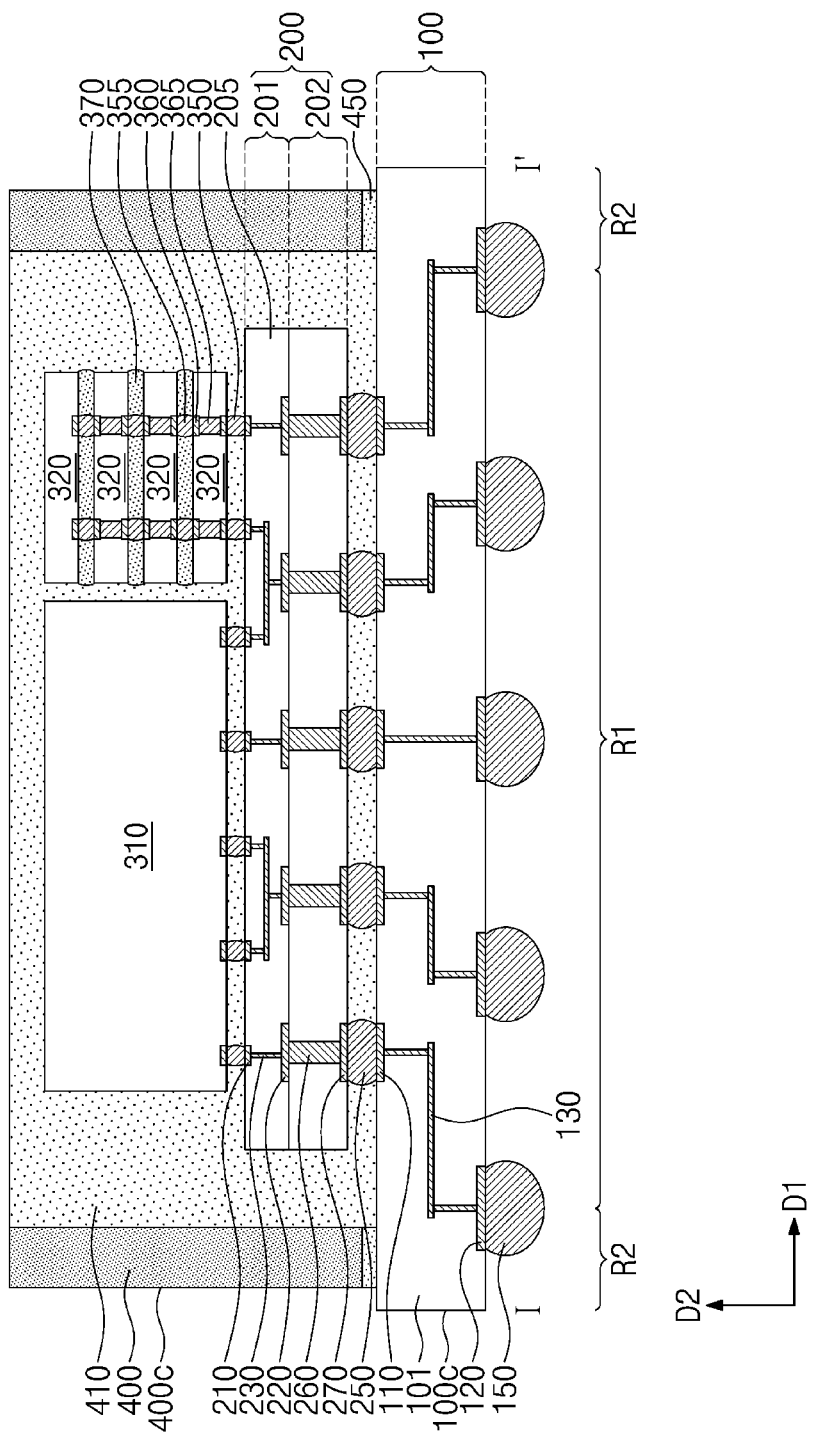

FIGS. 9, 11, and 13 illustrate plan views showing a method of fabricating a semiconductor package according to some embodiments of the present inventive concepts. FIGS. 10, 12, and 14 illustrate cross-sectional views taken along line I-I' of FIGS. 9, 11, and 13, respectively, showing a method of fabricating a semiconductor package according to some embodiments of the present inventive concepts. A duplicate description will be omitted below.

Referring to FIGS. 9 and 10, a lower substrate 100 may be provided which includes a central region R1 and an edge region R2. The lower substrate 100 may include lower substrate pads 110 adjacent to or provided at a top surface of the lower substrate 100. The lower substrate 100 may include a dielectric base layer 101, terminal pads 120 adjacent to or provided at a bottom surface of the lower substrate 100, and lower substrate lines 130 located in the dielectric base layer 101.

An upper substrate 200 may be placed on the central region R1 of the lower substrate 100. The upper substrate 200 may include a substrate layer 202 and a wiring layer 201 on the substrate layer 202. The wiring layer 201 may include upper pads 210, upper substrate lines 220, internal lines 230, and a wiring dielectric layer 205. The substrate layer 202 may include a plurality of through electrodes 260 that penetrate the substrate layer 202 and a plurality of lower pads 270 located adjacent to or provided at a bottom surface of the substrate layer 202. The placement of the upper substrate 200 may include providing a plurality of substrate bumps 250 on a bottom surface of the upper substrate 200, and coupling the substrate bumps 250 to lower substrate pads 110 of the lower substrate 100, respectively.

A first semiconductor chip 310 may be mounted on the upper substrate 200. Chip pads 360 may be provided adjacent to or provided at a bottom surface of the first semiconductor chip 310. The mounting of the first semiconductor chip 310 may include providing a plurality of chip bumps 350 on the bottom surface of the first semiconductor chip 310, and coupling the chip bumps 350 to upper pads 210 of the upper substrate 200, respectively.

A chip stack may be mounted on the central region R1 of the upper substrate 200. The chip stack includes a plurality of second semiconductor chips 320 that are stacked vertically (e.g., in a second direction D2) on each other. The chip stack may be spaced apart horizontally (e.g., in a first direction D1) from the first semiconductor chip 310. Chip pads 360 may be provided adjacent to or provided at a bottom surface of a lowermost one of the second semiconductor chips 320. The mounting of the chip stack may include providing a plurality of chip bumps 350 on the bottom surface of the lowermost second semiconductor chip 320, and coupling the chip bumps 350 to upper pads 210 of the upper substrate 200, respectively. However, there are no limitations, but various changes may be imposed on procedure sequences among the placement of the upper substrate 200, the mounting of the first semiconductor chip 310, and the mounting of the chip stack. The procedure sequences may be variously changed.

Referring to FIGS. 11 and 12, an adhesive layer 450 may be formed on the edge region R2 of the lower substrate 100. A reinforcing structure 400 may be formed on the edge region R2 of the lower substrate 100. For example, the reinforcing structure 400 may be formed on and in contact with the adhesive layer 450. Therefore, the reinforcing structure 400 may be fixed onto the lower substrate 100. When viewed in a plan view, the reinforcing structure 400 may be formed to surround the upper substrate 200. The reinforcing structure 400 may be formed spaced apart from the upper substrate 200. In some embodiments, the reinforcing structure 400 may be formed to have an outer wall 400c (e.g., an outer sidewall) that overlaps vertically (e.g., in the second direction D2) with a sidewall 100c of the lower substrate 100. In some embodiments, the reinforcing structure 400 may be formed to have an outer wall 400c (e.g., an outer sidewall) that is located between a sidewall 100c of the lower substrate 100 and a sidewall of the upper substrate 200.

Referring to FIGS. 13 and 14, a molding layer 410 may be formed on the lower substrate 100. The molding layer 410 may be formed to cover an inner wall (e.g., an inner sidewall) of the reinforcing structure 400, the top surface of the lower substrate 100, the first semiconductor chip 310, the second semiconductor chips 320, and the upper substrate 200. The molding layer 410 may fill a space between the lower substrate 100 and the upper substrate 200, a space between the upper substrate 200 and the first semiconductor chip 310, and a space between the upper substrate 200 and the lowermost second semiconductor chip 320. The molding layer 410 may be fill a space between the substrate bumps 250, thereby encapsulating each of the substrate bumps 250. The molding layer 410 may be fill a space between the chip bumps 350, thereby encapsulating each of the chip bumps 350.

The formation of the molding layer 410 may include coating a molding material on the lower substrate 100, and performing a curing process in which a high temperature pressure may be applied. The molding layer 410 may be formed in a vacuum state. As the molding layer 410 is formed in a vacuum state, it may be possible to prevent the formation of voids in the molding layer 410. The curing process may allow the molding layer 410 to have improved adhesive force and increased stability.

According to the present inventive concepts, without forming a separate under-fill layer, the molding layer 410 may be formed at once to simplify methods of fabricating semiconductor packages. For example, the molding layer 410 may be integrally formed in the same process step to fill a space between the lower substrate 100 and the upper substrate 200, a space between the upper substrate 200 and the first semiconductor chip 310, a space between the upper substrate 200 and the lowermost second semiconductor chip 320, a space between the substrate bumps 250 to encapsulate each of the substrate bumps 250, and a space between the chip bumps 350 to encapsulate each of the chip bumps 350. The present inventive concepts are not limited thereto. In some embodiments, the molding layer 410 may be formed using at least two process steps.

Referring back to FIGS. 1 and 2, after the formation of the molding layer 410, a grinding process may further be performed on the molding layer 410. The grinding process may expose the top surface of the first semiconductor chip 310 and the top surface of the uppermost second semiconductor chip 320.

In some embodiments, unlike FIG. 14, the molding layer 410 may be formed to expose the top surface of the first semiconductor chip 310 and the top surface of the uppermost second semiconductor chip 320. In this case, no grinding process may be performed separately.

Figure 15:
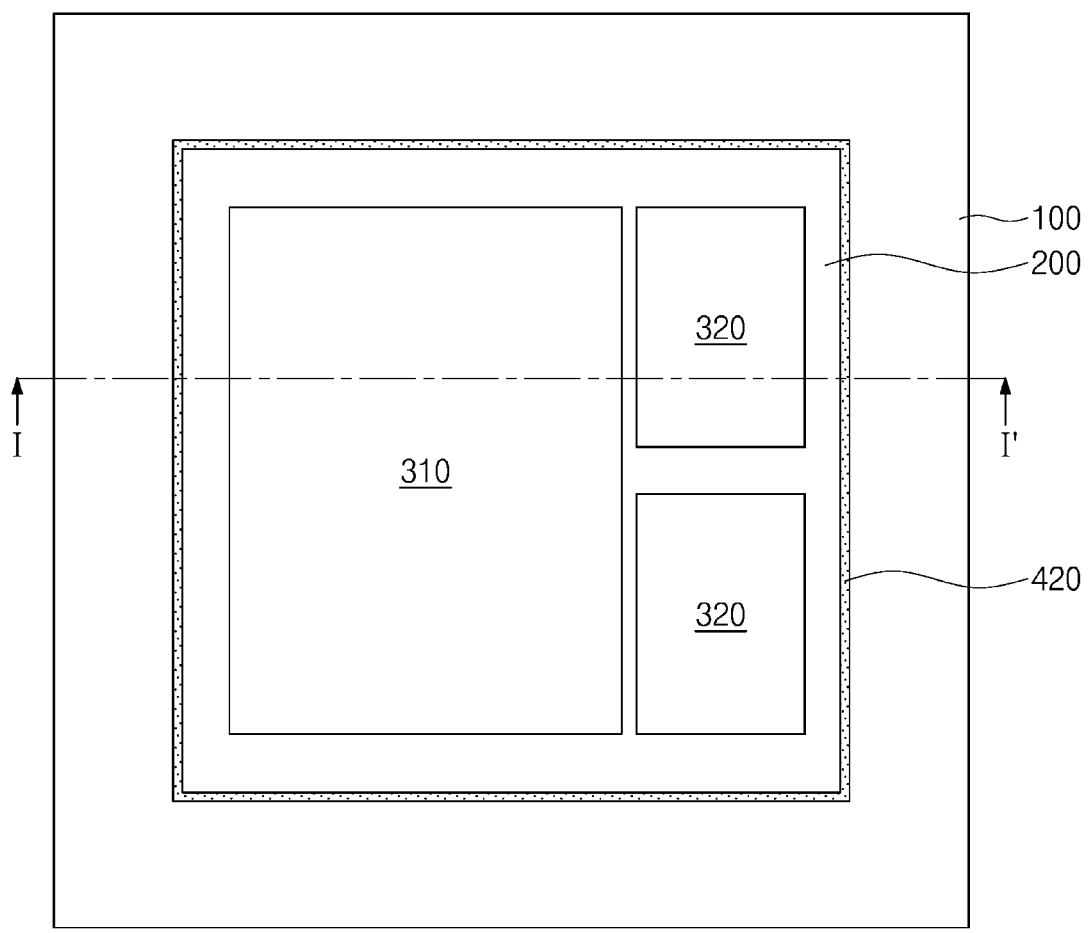
FIGS. 15 and 17 illustrate plan views showing a method of fabricating a semiconductor package according to some embodiments of the present inventive concepts.
Figure 16:
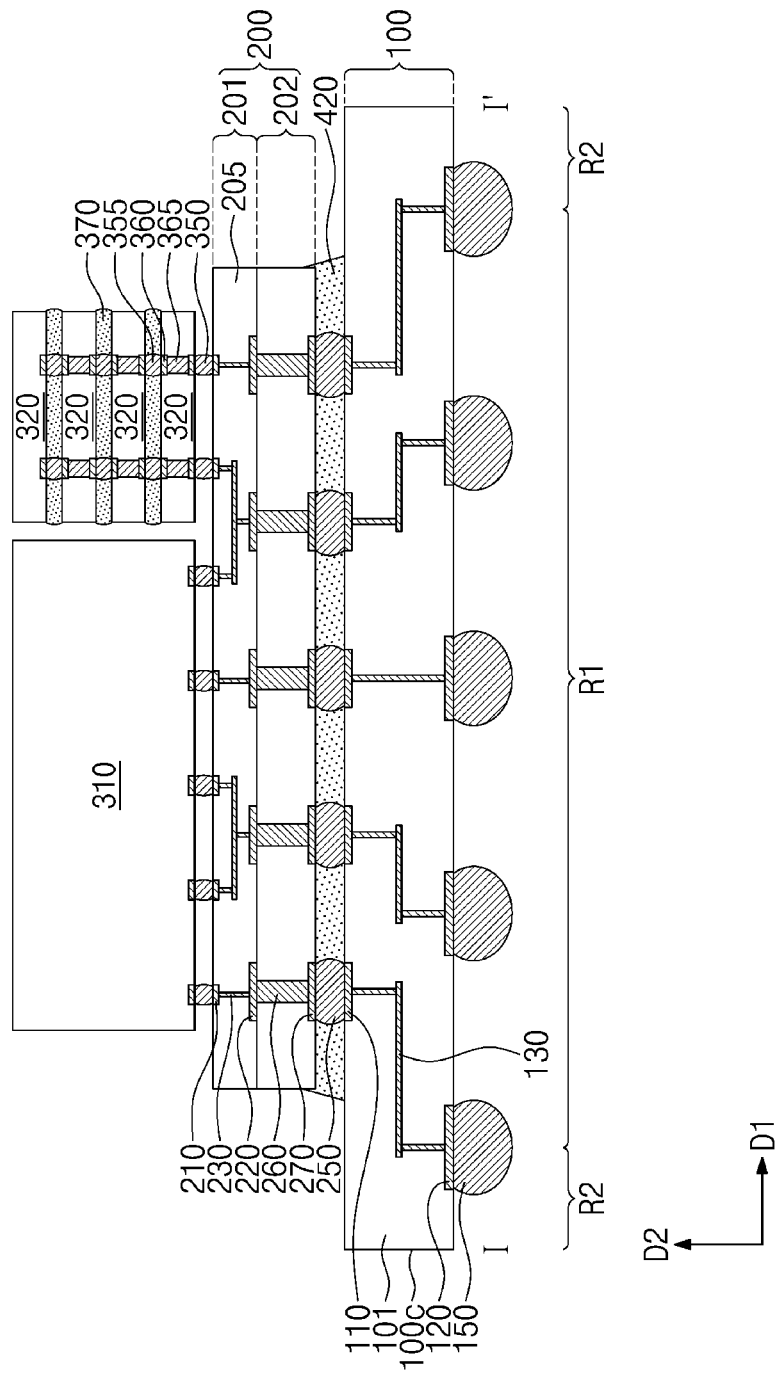
FIGS. 16 and 18 illustrate cross-sectional views taken along line I-I' of FIGS. 15 and 17, respectively, showing a method of fabricating a semiconductor package according to some embodiments of the present inventive concepts.
Figure 17:
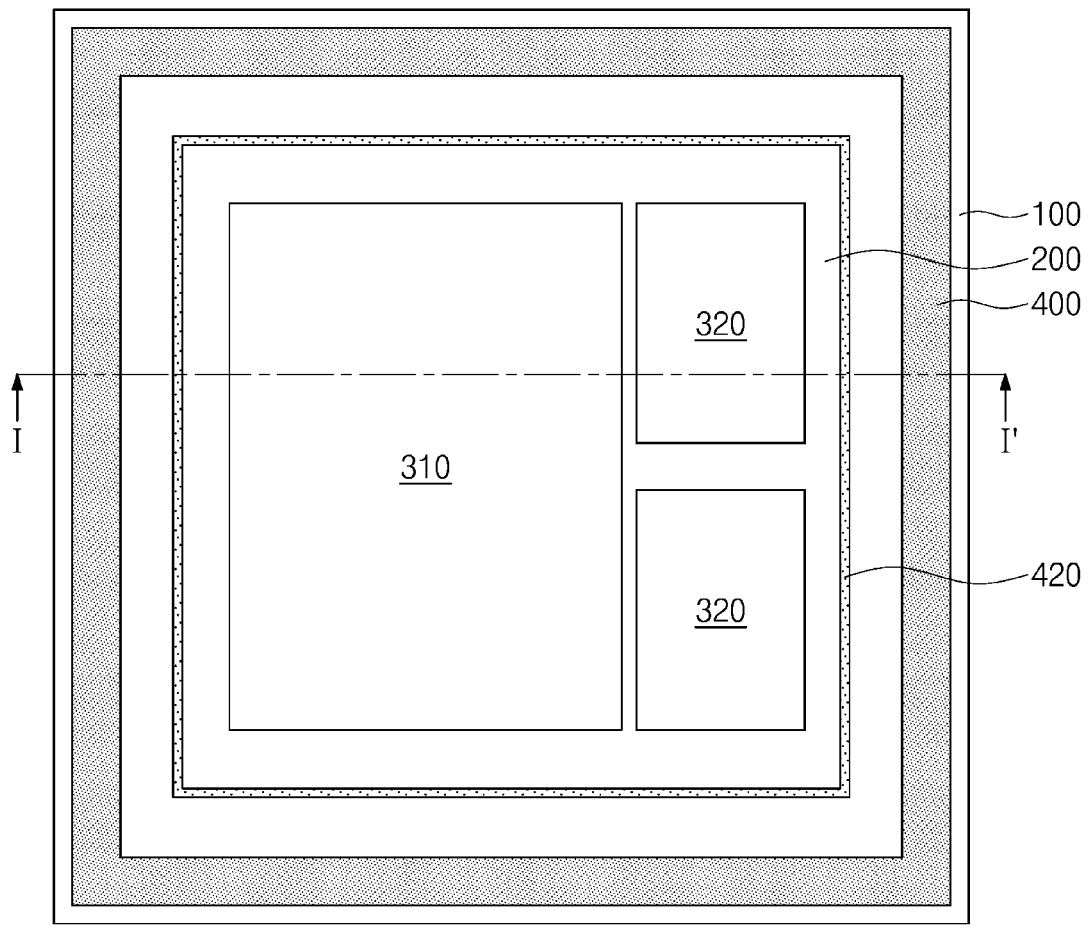
Figure 18:
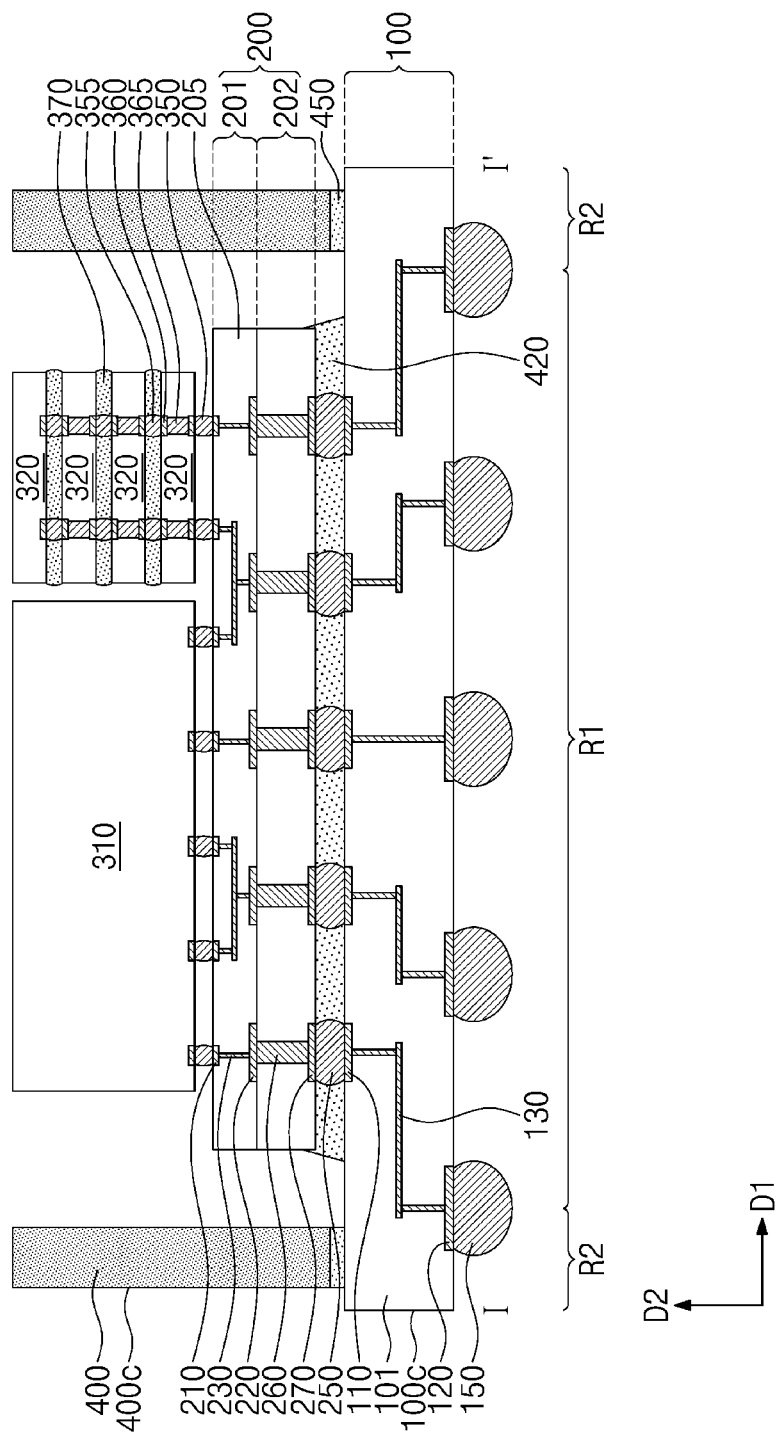

FIGS. 15 and 17 illustrate plan views showing a method of fabricating a semiconductor package according to some embodiments of the present inventive concepts. FIGS. 16 and 18 illustrate cross-sectional views taken along line I-I' of FIGS. 15 and 17, respectively, showing a method of fabricating a semiconductor package according to some embodiments of the present inventive concepts. A duplicate description will be omitted below.

Referring to FIGS. 15 and 16, a lower substrate 100 may be provided which includes a central region R1 and an edge region R2. An upper substrate 200 may be placed on the central region R1 of the lower substrate 100. A first semiconductor chip 310 may be mounted on the upper substrate 200. A chip stack may be mounted on the central region R1 of the upper substrate 200. The chip stack includes a plurality of second semiconductor chips 320 that are stacked vertically (e.g., in the second direction D2). However, no limitation is imposed on the procedure sequences among the placement of the upper substrate 200, the mounting of the first semiconductor chip 310, and the mounting of the chip stack.

The descriptions above with reference to FIGS. 9 and 10 may be substantially identically applicable to the providing of the lower substrate 100, the placement of the upper substrate 200, the mounting of the first semiconductor chip 310, and the mounting of the chip stack.

A lower molding layer 420 may be formed on the lower substrate 100. The lower molding layer 420 may be formed to cover a portion of the top surface of the lower substrate 100. The lower molding layer 420 may fill a space between the lower substrate 100 and the upper substrate 200. The formation of the lower molding layer 420 may include encapsulating each of the substrate bumps 250 by filling a space between the substrate bumps 250.

In some embodiments, the formation of the lower molding layer 420 may be preceded by the placement of the upper substrate 200. In some embodiments, the formation of the lower molding layer 420 may be preceded by the mounting of the first semiconductor chip 310. In some embodiments, the formation of the lower molding layer 420 may be preceded by the mounting of the chip stack. For example, the formation of the lower molding layer 420 is not be limited to a particular sequence, but may be variously changed.

Referring to FIGS. 17 and 18, an adhesive layer 450 and a reinforcing structure 400 may be formed on the edge region R2 of the lower substrate 100. The formation of the adhesive layer 450 and the formation of the reinforcing structure 400 may be substantially the same as those discussed with reference to FIGS. 11 and 12.

Referring to FIGS. 5 and 6, an upper molding layer 415 may be formed on the lower substrate 100. The upper molding layer 415 may be formed to cover the inner wall (e.g., an inner sidewall) of the reinforcing structure 400, a portion of the top surface of the lower substrate 100, the top surface of the upper substrate 200, a portion of the sidewall of the upper substrate 200, the sidewalls of the second semiconductor chips 320, and the lower molding layer 420. The upper molding layer 415 may fill a space between the upper substrate 200 and the first semiconductor chip 310 and a space between the upper substrate 200 and the lowermost second semiconductor chip 320. The upper molding layer 415 may be fill a space between the chip bumps 350, thereby encapsulating each of the chip bumps 350.

The formation of the upper molding layer 415 may include coating a molding material on the lower substrate 100, and performing a curing process that applies high temperature pressure. The upper molding layer 415 may be formed in a vacuum state. As the upper molding layer 415 is formed in a vacuum state, it may be possible to prevent the formation of voids in the upper molding layer 415. The curing process may allow the upper molding layer 415 to have improved adhesive force and increased stability as well.

According to the present inventive concepts, without forming a separate under-fill layer, the upper molding layer 415 may be formed at once to simplify methods of fabricating semiconductor packages. For example, the upper molding layer 415 may be integrally formed using a single process to fill a space between the upper substrate 200 and the first semiconductor chip 310 and a space between the upper substrate 200 and the lowermost second semiconductor chip 320. The upper molding layer 415 may be fill a space between the chip bumps 350, thereby encapsulating each of the chip bumps 350. The upper molding layer 415 may be connected to the lower molding layer 420.

A semiconductor package according to some embodiments of the present inventive concepts may not include an under-fill layer separately, may include a reinforcing structure located on a substrate, and may include a molding layer that covers an inner wall of the reinforcing structure and fills a space between the substrate and a semiconductor chip, which may result in an increase in mechanical strength of the semiconductor package.

According to the present inventive concepts, a horizontal distance may be minimized between the semiconductor chips. Therefore, a signal delivery speed may be maximized between the semiconductor chips, and accordingly, the semiconductor chips of the semiconductor package may operate faster using a signal with improved electrical characteristics. Moreover, the semiconductor package may effectively become compact-sized compared to if an under-fill layer is used.

According to the present inventive concepts, without forming a separate under-fill layer, the molding layer may be formed at once to simplify methods of fabricating the semiconductor packages.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a lower substrate that includes a central region and an edge region;
an upper substrate on the central region of the lower substrate;
a first semiconductor chip on the upper substrate;
a second semiconductor chip on the upper substrate and horizontally spaced apart from the first semiconductor chip in a first direction;
a reinforcing structure on the edge region of the lower substrate,
wherein the reinforcing structure is formed of a metallic conductive material; and
a molding layer that covers an inner sidewall of the reinforcing structure, a top surface of the lower substrate, a sidewall of the first semiconductor chip, a sidewall of the second semiconductor chip, and the upper substrate, the molding layer being interposed between the lower substrate and the upper substrate, between the upper substrate and the first semiconductor chip, and between the upper substrate and the second semiconductor chip, and disposed on the central region,
wherein the first semiconductor chip is of a different type from the second semiconductor chip,
wherein the first direction is parallel to the top surface of the lower substrate,
wherein a portion of the molding layer is disposed between the first semiconductor chip and the second semiconductor chip, and
wherein a lower surface of the molding layer is at a lower level than a lower surface of the reinforcing structure, and
wherein an upper surface of the reinforcing structure is at the same level as or higher than an upper surface of the molding layer.

2. The semiconductor package of claim 1,
wherein a distance in the first direction between outer sidewalls, opposite to each other, of the reinforcing structure is less than a width in the first direction between sidewalls, opposite to each other, of the lower substrate.

3. The semiconductor package of claim 1,
wherein the molding layer exposes a top surface of the first semiconductor chip and a top surface of the second semiconductor chip.

4. The semiconductor package of claim 1, further comprising:
an adhesive layer between the lower substrate and the reinforcing structure.

5. The semiconductor package of claim 1, further comprising:

a plurality of substrate bumps interposed between the lower substrate and the upper substrate and electrically connecting the lower substrate to the upper substrate; and
a plurality of chip bumps between the upper substrate and the first semiconductor chip and between the upper substrate and the second semiconductor chip,
wherein the molding layer is further interposed between two adjacent substrate bumps of the plurality of substrate bumps and encapsulates each of the plurality of substrate bumps, and
wherein the molding layer is further interposed between two adjacent chip bumps of the plurality of chip bumps and encapsulates each of the plurality of chip bumps.

6. The semiconductor package of claim 1,
wherein the reinforcing structure includes at least one selected from copper (Cu), titanium (Ti), palladium (Pd), aluminum (Al), nickel (Ni), gold (Au), platinum (Pt), and stainless steels (SUS).

7. The semiconductor package of claim 1,
wherein the molding layer includes silica.

8. The semiconductor package of claim 1,
wherein a minimum distance in a first direction between the sidewall of the first semiconductor chip and the sidewall of the second semiconductor chip is in a range of from about 1 µm to about 100 µm,
wherein the sidewall of the first semiconductor chip is adjacent, in the first direction, to the sidewall of the second semiconductor chip, and
wherein the first direction is parallel to the top surface of the lower substrate.

9. The semiconductor package of claim 1,
wherein, when viewed in a plan view, an outer perimeter of the reinforcing structure is of a square ring shape or a square ring shape with a rounded corner.

10. The semiconductor package of claim 1, further comprising:
a thermal radiation plate on at least one selected from a top surface of the first semiconductor chip and a top surface of the second semiconductor chip.

11. A semiconductor package, comprising:
a lower substrate that includes a central region and an edge region;
an upper substrate on the central region of the lower substrate;
a first semiconductor chip on a top surface of the upper substrate;
a chip stack on the top surface of the upper substrate and spaced apart in a first direction from the first semiconductor chip, the chip stack including a plurality of second semiconductor chips that are stacked on each other, and the first direction being parallel to a top surface of the lower substrate;
a plurality of substrate bumps interposed between the lower substrate and the upper substrate and electrically connecting the lower substrate to the upper substrate;
a plurality of chip bumps between the upper substrate and the first semiconductor chip and between the upper substrate and the second semiconductor chip;
a reinforcing structure on the edge region of the lower substrate,
wherein the reinforcing structure is formed of a metallic conductive material; and
a molding layer that covers the top surface of the lower substrate and an inner sidewall of the reinforcing structure,
wherein the molding layer includes:

a lower molding layer between the lower substrate and the upper substrate; and an upper molding layer that covers a sidewall of the first semiconductor chip, a sidewall of the chip stack, the top surface of the upper substrate, a side surface of the lower molding layer and a sidewall of the upper substrate, the upper molding layer being interposed between the upper substrate and the first semiconductor chip and between the upper substrate and the chip stack.

12. The semiconductor package of claim 11,
wherein a distance in the first direction between outer sidewalls, opposite to each other, of the reinforcing structure is less than a width in the first direction between sidewalls, opposite each other, of the lower substrate.

13. The semiconductor package of claim 11,
wherein the upper molding layer is further interposed between two adjacent chip bumps of the plurality of chip bumps and encapsulates each of the plurality of chip bumps, and
wherein the lower molding layer is further interposed between two adjacent substrate bumps of the substrate bumps and encapsulates each of the plurality of substrate bumps.

14. The semiconductor package of claim 11,
wherein the lower molding layer covers a first portion of the top surface of the lower substrate; and
wherein the upper molding layer covers the lower molding layer and a second portion of the top surface of the lower substrate.

15. The semiconductor package of claim 12,
wherein the upper molding layer and the lower molding layer include silica,
wherein an amount of the silica in each of the upper and lower molding layers is greater than 0%, and
wherein an amount of the silica in the upper molding layer is different from an amount of the silica in the lower molding layer.

16. The semiconductor package of claim 15,
wherein the amount of the silica in the upper molding layer is in a range of from about 50% to about 100%, and
wherein the amount of the silica in the lower molding layer is in a range of greater than about 0% to about 50%.

17. The semiconductor package of claim 11, further comprising:
a chip under-fill layer between two adjacent second semiconductor chips of the plurality of second semiconductor chips,
wherein the chip under-fill layer includes a material different from a material of the molding layer.

18. A method of fabricating a semiconductor package, the method comprising:
providing a lower substrate that includes a central region and an edge region, the lower substrate including a plurality of lower substrate pads at a top surface of the lower substrate;
placing an upper substrate on the central region of the lower substrate;
mounting a first semiconductor chip on the upper substrate;
mounting on the upper substrate a second semiconductor chip, wherein on the upper substrate, the second semiconductor chip is horizontally spaced apart from the first semiconductor chip;
forming a reinforcing structure on the edge region of the lower substrate; and
forming, after the forming of the reinforcing structure, a molding layer that covers an inner sidewall of the reinforcing structure and fills a space between the lower substrate and the upper substrate, a space between the upper substrate and the first semiconductor chip, and a space between the upper substrate and the second semiconductor chip on the central region,
wherein a lower surface of the molding layer is at a lower level than a lower surface of the reinforcing structure, and
wherein an upper surface of the reinforcing structure is at the same level as or higher than an upper surface of the molding layer.

19. The method of claim 18,
wherein the placing of the upper substrate includes:
providing a plurality of substrate bumps on a bottom surface of the upper substrate; and
coupling the plurality of substrate bumps to the plurality of lower substrate pads of the lower substrate, respectively,
wherein the molding layer fills a space between two adjacent substrate bumps of the plurality of substrate bumps and encapsulates each of the plurality of substrate bumps.

20. The method of claim 18, further comprising:
performing, after the forming of the molding layer, a grinding process on the molding layer,
wherein the grinding process exposes a top surface of the first semiconductor chip and a top surface of the second semiconductor chip.

* * * * *